(12) United States Patent
Kamata

(10) Patent No.: US 8,358,530 B2
(45) Date of Patent: Jan. 22, 2013

(54) SEMICONDUCTOR DEVICE

(75) Inventor: Koichiro Kamata, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/224,563

(22) Filed: Sep. 2, 2011

(65) Prior Publication Data

US 2012/0063204 A1 Mar. 15, 2012

(30) Foreign Application Priority Data

Sep. 10, 2010 (JP) ................................. 2010-202553

(51) Int. Cl.
*G11C 11/24* (2006.01)
(52) U.S. Cl. .................................. 365/149; 365/189.07
(58) Field of Classification Search ............... 365/185.1, 365/185.14, 185.26, 149, 189.07, 189.09
See application file for complete search history.

(56) References Cited

U.S. PATENT DOCUMENTS

| | | | |
|---|---|---|---|
| 4,466,081 A | 8/1984 | Masuoka | |
| 6,127,702 A | 10/2000 | Yamazaki et al. | |
| 6,804,142 B2* | 10/2004 | Forbes | 365/149 |
| 2006/0102910 A1* | 5/2006 | Yamazaki et al. | 257/83 |
| 2010/0148171 A1 | 6/2010 | Hayashi et al. | |
| 2011/0101351 A1 | 5/2011 | Yamazaki | |
| 2011/0121878 A1 | 5/2011 | Kato et al. | |
| 2011/0122673 A1 | 5/2011 | Kamata et al. | |
| 2011/0128777 A1* | 6/2011 | Yamazaki et al. | 365/149 |
| 2011/0286256 A1* | 11/2011 | Kamata | 365/72 |
| 2011/0317500 A1* | 12/2011 | Uochi et al. | 365/189.011 |

FOREIGN PATENT DOCUMENTS

| | | |
|---|---|---|
| EP | 0 053 878 A2 | 6/1982 |
| JP | 57-105889 A | 7/1982 |
| JP | 11-025682 A | 1/1999 |

OTHER PUBLICATIONS

Tomoyuki Ishii et al.; "A Poly-Silicon TFT With a Sub-5-nm Thick Channel for Low-Power Gain Cell Memory in Mobile Applications"; IEEE Transactions on Electron Devices; Nov. 1, 2004; vol. 51; No. 11; pp. 1805-1810.
Wonchan Kim et al.; "An Experimental High-Density DRAM Cell with a Built-in Gain Stage"; IEEE Journal of Solid-State Circuits; Aug. 1, 1994; vol. 29, No. 8; pp. 978-981.
Shoji Shukuri et al.; "A Complementary Gain Cell Technology for Sub-1 V Supply DRAMs"; IEDM 92: Technical Digest of International Electron Devices Meeting; Dec. 13, 1992; pp. 1006-1008.
Shoji Shukuri et al.; "A Semi-Static Complementary Gain Cell Technology for Sub-1 V Supply DRAM's"; IEEE Transactions on Electron Devices; Jun. 1, 1994; vol. 41, No. 6; pp. 926-931.

* cited by examiner

*Primary Examiner* — Douglas King
(74) *Attorney, Agent, or Firm* — Fish & Richardson P.C.

(57) ABSTRACT

One object is to provide a novel semiconductor device which can hold stored data even when not powered and which has an unlimited number of writing operations. Another object is to reduce a circuit size and to improve reliability of writing and reading of data. When a memory cell using a transistor including an oxide semiconductor layer is subjected to the verification operation and reading of data, a dual-gate transistor showing different threshold voltages is used as a resistor; thus, stable verification operation and reading operation can be performed by only a reference potential circuit.

5 Claims, 17 Drawing Sheets

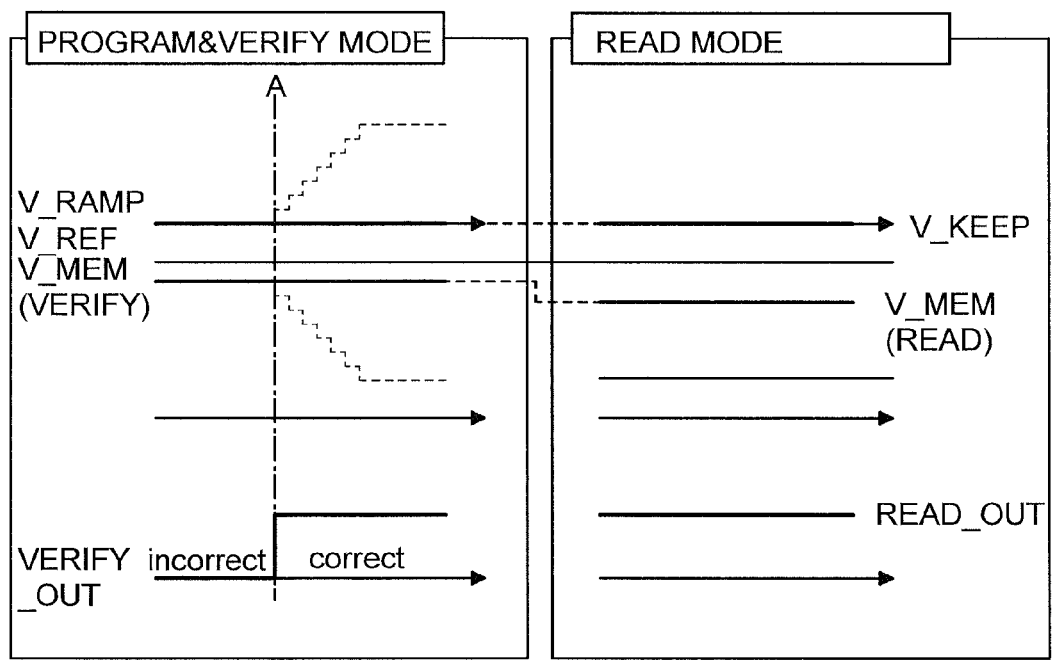

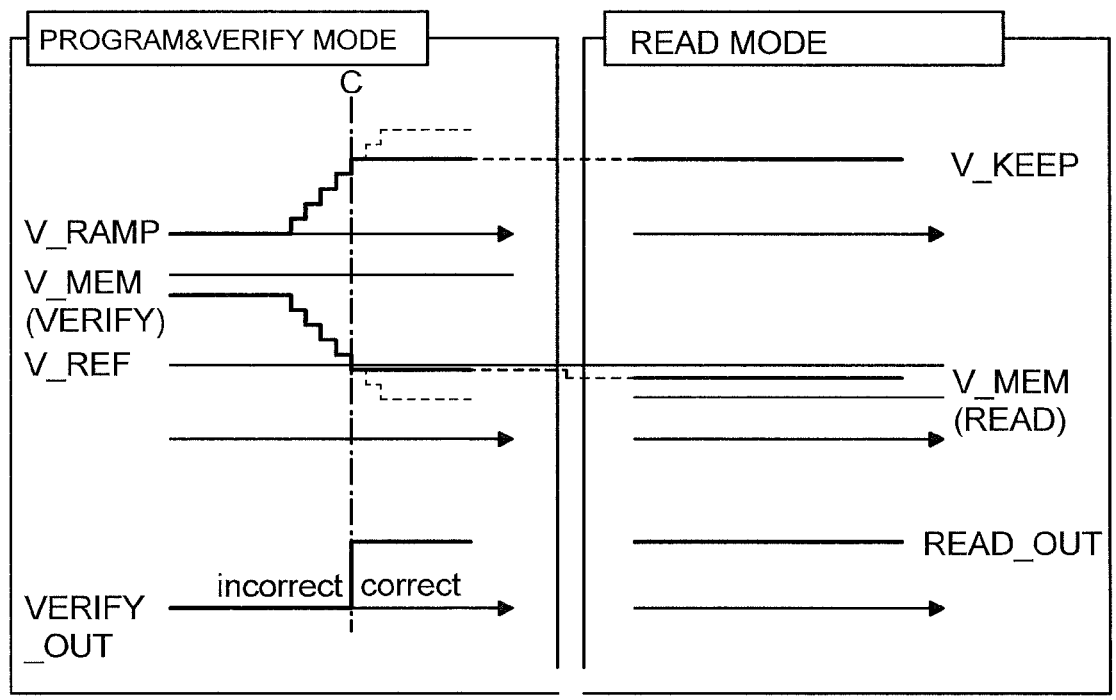

400  450a  437

450b

453

SEMICONDUCTOR DEVICE

BACKGROUND OF THE INVENTION

1. Field of the Invention

One embodiment of the invention disclosed herein relates to a semiconductor device including a semiconductor element.

2. Description of the Related Art

Memory devices including semiconductor elements, which are included in the category of semiconductor devices, are broadly classified into two categories: volatile memory devices that lose stored data when not powered, and nonvolatile memory devices that hold stored data even when not powered.

A typical example of volatile memory devices is a dynamic random access memory (DRAM). A DRAM stores data in such a manner that a transistor included in a storage element is selected and charge is held in a capacitor.

When data is read from a DRAM, charge in a capacitor is lost according to the above-described principle; thus, another writing operation is necessary every time data is read out. Moreover, a transistor included in a memory element has leakage current (off-state current) between a source and a drain in an off state or the like and charge flows into or out of the transistor even if the transistor is not selected, which makes a data holding period short. For that reason, writing operation (refresh operation) is necessary at predetermined intervals, and it is difficult to sufficiently reduce power consumption. Furthermore, since stored data is lost when power supply stops, another memory device utilizing a magnetic material or an optical material is needed in order to hold the stored data for a long time.

Another example of volatile memory devices is a static random access memory (SRAM). An SRAM holds stored data by using a circuit such as a flip-flop and thus does not need refresh operation, which is an advantage over a DRAM. However, cost per storage capacity is high because a circuit such as a flip-flop is used. Moreover, as in a DRAM, stored data in an SRAM is lost when power supply stops.

A typical example of nonvolatile memory devices is a flash memory. A flash memory includes a floating gate between a gate electrode and a channel formation region in a transistor and stores data by holding charge in the floating gate. Therefore, a flash memory has advantages in that the data holding period is extremely long (semi-permanent) and refresh operation which is necessary to volatile memory devices is not needed (e.g., see Patent Document 1).

However, in a flash memory, there is a degradation problem in that a memory element becomes unable to function after a predetermined number of writing operations because a gate insulating layer included in the memory element deteriorates due to tunneling current generated in writing operations. In order to reduce the effects of this problem, a method in which the number of writing operations is equalized among memory elements can be employed, for example, but a complex peripheral circuit is needed to realize this method. Moreover, even when such a method is employed, the fundamental problem of lifetime cannot be resolved. In other words, a flash memory is not suitable for applications in which data is frequently rewritten.

In the flash memory, in order to increase storage capacity, a "multilevel" flash memory that stores data with greater than two stages in one memory cell is proposed (e.g., see Patent Document 2).

REFERENCE

[Patent Document 1] Japanese Published Patent Application No. S57-105889

[Patent Document 2] Japanese Published Patent Application No. H11-25682

SUMMARY OF THE INVENTION

However, in a multilevel memory, a variety of different potential values are used along with a mass storage; therefore, there are problems in that the number of required circuits is increased and the size and cost of a semiconductor device are increased.

A multilevel memory is generally foamed using circuits including a plurality of transistors, and variation in potential values occurs per memory cell due to variation in transistors even when the same potential is used. Because of these variations, there is a problem in that data cannot be written and cannot be read correctly in some cases. As one method for solving such a problem, verification operation is generally performed. However, the judgment of the verification operation is performed so as to confirm that a threshold potential after data is written is within a predetermined range; therefore, a potential is held at beyond the threshold potential. At this time, in the case where the threshold potential in reading of data is equal to that in writing of data, there is little margin between the potential held in writing of data and the potential in reading of data. In other words, when judgment is performed in such a state, the potential in reading of data is below the threshold potential due to discharge of a little charge, so that wrong data is read. When a phenomenon in which the threshold potential varies due to noise or the like from the outside, a so-called chattering phenomenon occurs, there is a problem in that reading of data cannot be performed correctly.

In view of the problems, a method in which two kinds of potentials (a potential in the verification operation and a reference potential in reading of data) are prepared and controlled, and a method in which a reference potential is controlled by a peripheral circuit such as a switch are assumed. However, these methods have a problem in that a circuit size is increased and power consumption is also increased.

In view of the foregoing problems, one object of one embodiment of the disclosed invention is to provide a novel semiconductor device, which can hold stored data even when not powered and which has an unlimited number of writing operations.

Another object of one embodiment of the disclosed invention is to reduce a circuit size and to improve reliability of writing and reading of data by a novel semiconductor device.

According to one embodiment of the present invention disclosed in this specification, when a memory cell using a transistor including an oxide semiconductor layer is subjected to the verification operation and reading of data, a dual-gate transistor showing different threshold voltages is used as a resistor; thus, stable verification operation and reading operation can be performed by only a reference potential circuit.

According to one embodiment of the present invention disclosed in this specification, when data is written to a memory cell using a transistor including an oxide semiconductor layer, a writing potential is gradually increased, and at the same time reading current is confirmed; a result of the reading current is used for the writing potential and multilevel data is written. In other words, it is possible to perform writing operation and verifying operation at the same time and to perform highly reliable writing.

As a transistor used for a memory cell, a transistor including a material which can sufficiently reduce the off-state current, for example, a wide-gap material (more specifically, for example, a semiconductor material having an energy gap Eg of more than 3 eV) for a semiconductor layer is used. Since an oxide semiconductor material is a wide-gap material, the oxide semiconductor material is used as an oxide semiconductor included in a transistor of a semiconductor device. The use of a semiconductor material capable of sufficiently reducing the off-state current of a transistor enables data to be held for a long time.

According to one embodiment of a semiconductor device disclosed in this specification, a semiconductor device includes: a memory cell including a first transistor, a second transistor, and a capacitor, wherein a first gate terminal of the first transistor is electrically connected to a word line, a first source terminal of the first transistor is electrically connected to a bit line, a first drain terminal of the first transistor is electrically connected to a source line, the first transistor is fanned using a substrate including a semiconductor material, a second gate terminal of the second transistor is electrically connected to a word line for an oxide semiconductor, a second source terminal of the second transistor is electrically connected to a bit line for an oxide semiconductor, a second drain terminal of the second transistor is electrically connected to the first gate terminal of the first transistor, and the second transistor includes an oxide semiconductor layer, and the first gate terminal of the first transistor is electrically connected to the word line through the capacitor; a resistor formed using a dual-gate transistor including a third source terminal, a third drain terminal, a third gate terminal, and a fourth gate terminal, wherein the third source terminal and the third gate terminal are electrically connected to a terminal to which power supply voltage is input, and the third drain terminal is electrically connected to the bit line; a reference potential circuit configured to output a reference potential; a potential comparison circuit electrically connected to the reference potential circuit and the bit line, and the potential comparison circuit configured to compare the reference potential output by the reference potential circuit with a potential of the bit line; and a control circuit electrically connected to the potential comparison circuit, and an output potential of the potential comparison circuit is supplied to a power supply control circuit portion and a state change circuit portion. In the control circuit, the state change circuit portion is electrically connected to an input portion of the power supply control circuit portion and the fourth gate terminal of the resistor and is configured to supply a potential to the fourth gate terminal, and the power supply control circuit portion is electrically connected to the bit line for the oxide semiconductor and is configured to supply a potential to the bit line for the oxide semiconductor.

In addition, in the above structure, the reference potential circuit may be a plurality of reference potential circuits configured to output respective potentials.

Further, in the above structure, the semiconductor material may be a single crystal semiconductor substrate.

Further, in the above structure, the semiconductor material may be silicon.

Further, in the above structure, the oxide semiconductor layer may be formed using an oxide semiconductor material including In, Ga, and Zn.

Note that in the above embodiment, the second transistor may be formed using an oxide semiconductor material; the invention disclosed herein is not limited thereto. An oxide semiconductor material, for example, a widegap material (more specifically, a semiconductor material having an energy gap Eg of more than 3 eV, for example) or the like may be employed.

Note that the term "over" or "below" in this specification and the like does not necessarily mean that a component is placed "directly on" or "directly under" another component. For example, the expression "a gate electrode over a gate insulating layer" does not exclude the case where a component is placed between the gate insulating layer and the gate electrode.

In addition, the term "electrode" or "wiring" in this specification and the like does not limit a function of a component. For example, an "electrode" can be used as part of a "wiring", and the "wiring" can be used as part of the "electrode". Furthermore, the term "electrode" or "wiring" can include the case where a plurality of "electrodes" or "wirings" is formed in an integrated manner.

Functions of a "source" and a "drain" are sometimes interchanged with each other when a transistor of opposite polarity is used or when the direction of current flowing is changed in circuit operation, for example. Therefore, the terms "source" and "drain" can be used to denote the drain and the source, respectively, in this specification and the like.

Note that the term "electrically connected" in this specification and the like includes the case where components are connected through an "object having any electric function". There is no particular limitation on an object having any electric function as long as electric signals can be transmitted and received between components that are connected through the object.

Examples of an "object having any electric function" are a switching element such as a transistor, a resistor, an inductor, a capacitor, and an element with a variety of functions as well as an electrode and a wiring.

Since the off-state current of a transistor including an oxide semiconductor is extremely low, stored data can be held for an extremely long time by using the transistor. In other words, power consumption can be adequately reduced because refresh operation becomes unnecessary or the frequency of refresh operation can be extremely low. Moreover, stored data can be held for a long time even when power is not supplied.

Further, a semiconductor device according to one embodiment of the invention disclosed herein does not need high voltage for writing of data and there is no problem of deterioration of elements. For example, since there is no need to perform injection of electrons to a floating gate and extraction of electrons from the floating gate which are needed in a conventional nonvolatile memory, deterioration of a gate insulating layer does not occur. In other words, the semiconductor device according to one embodiment of the invention disclosed herein does not have a limit on the number of writing operations which is a problem in a conventional nonvolatile memory, and reliability thereof is drastically improved. Furthermore, data is written depending on the on state and the off state of the transistor, whereby high-speed operation can be easily realized. In addition, there is no need of operation for erasing data.

Since a transistor including a material other than an oxide semiconductor can operate at sufficiently high speed, a semiconductor device can perforin operation (e.g., reading data) at sufficiently high speed in combination of a transistor including an oxide semiconductor. Further, a transistor including a material other than an oxide semiconductor can favorably realize a variety of circuits (such as a logic circuit or a driver circuit) which is required to operate at high speed.

Thus, a semiconductor device having a novel feature can be achieved by being provided with both the transistor including a semiconductor material which is not an oxide semiconductor (a transistor capable of operation at a sufficiently high speed, in general) and the transistor including an oxide semiconductor (a transistor whose off-state current is sufficiently low, in general).

According to one embodiment of the invention disclosed herein, when data is written, the writing potential is gradually increased, and at the same time the reading current is confirmed; the result of the reading current is used for the writing potential, whereby an effect of variation in a transistor of a memory cell can be reduced and data can be stably written.

According to one embodiment of the invention disclosed herein, when a dual-gate transistor showing different threshold voltages is used as a resistor in the verification operation and in reading of data, a margin between a potential for the verification operation and the potential for reading of data can be provided; thus, stable reading can be performed by only a reference potential circuit. Therefore, a circuit size can be reduced.

BRIEF DESCRIPTION OF THE DRAWINGS

FIGS. 5A and 5B are timing diagrams.
FIGS. 7A and 7B are timing diagrams.

DETAILED DESCRIPTION OF THE INVENTION

Figure 1:
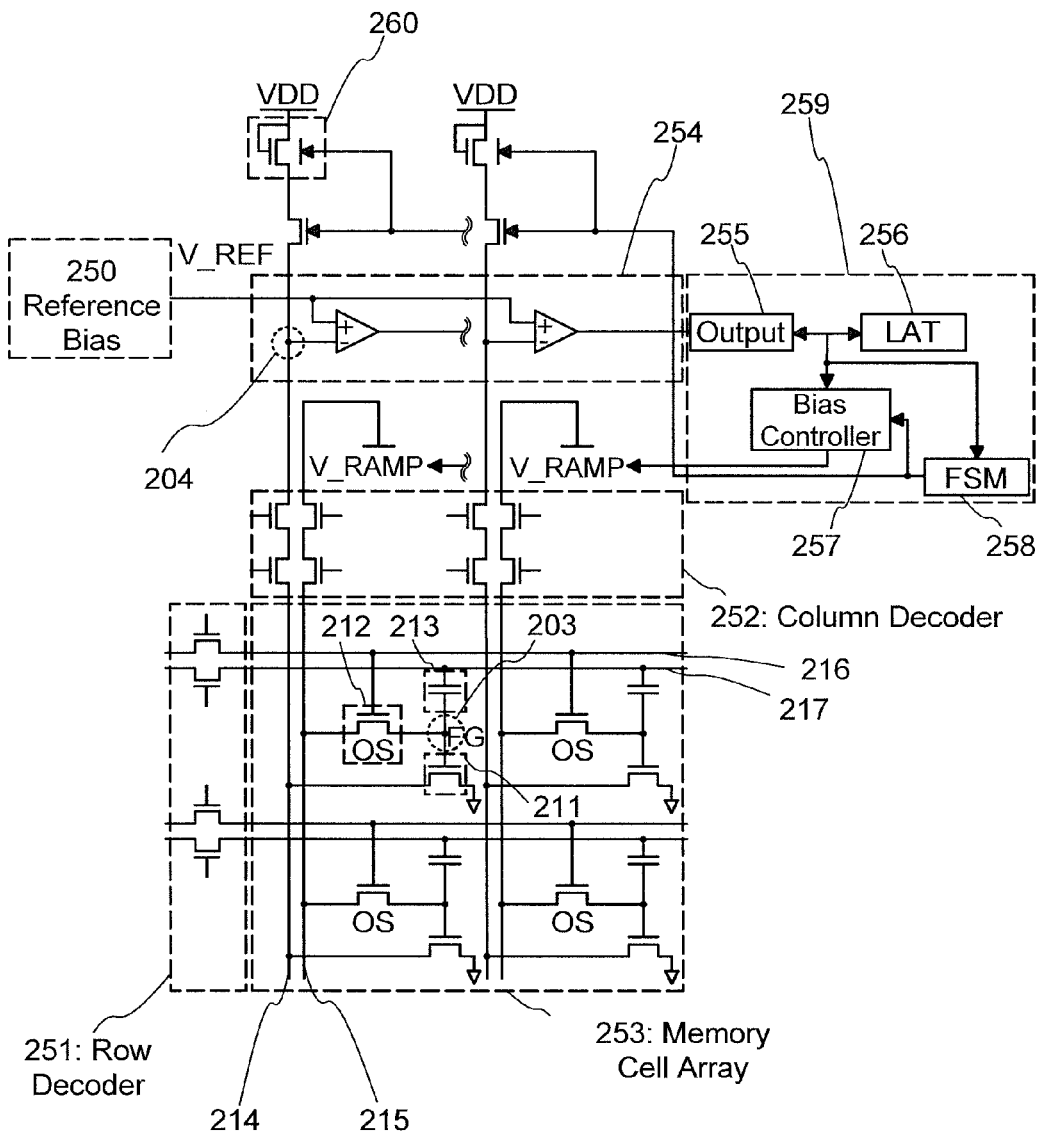
FIG. 1 is a circuit diagram of a semiconductor device.

Examples of embodiments of the present invention will be described below with reference to the drawings. Note that the present invention is not limited to the following description and it will be readily appreciated by those skilled in the art that the modes and details of the present invention can be modified in various ways without departing from the spirit and scope thereof. Therefore, the present invention should not be interpreted as being limited to the description in the following embodiments.

Note that the position, size, range, or the like of each component illustrated in drawings and the like is not accurately represented in some cases for easy understanding. Therefore, the invention disclosed herein is not necessarily limited to the position, size, range, or the like as disclosed in the drawings and the like.

Note that ordinal numbers such as "first", "second", and "third" in this specification and the like are used in order to avoid confusion among components, and the terms do not limit the components numerically.

Embodiment 1

In this embodiment, a semiconductor device according to one embodiment of the invention disclosed herein will be described with reference to FIG. 1, FIG. 2, and FIGS. 3A and 3B. Note that in some circuit diagrams, "OS" is written beside a transistor in order to indicate that the transistor includes an oxide semiconductor (OS).

<Circuit Configuration>

First, a circuit configuration will be described with reference to FIG. 1. The circuit configuration in FIG. 1 is a NOR memory (1 bit/cell) and includes a memory cell array 253 in which a plurality of memory cells is arranged in a matrix, a reference potential circuit 250, a potential comparison circuit 254, a control circuit 259 used for controlling the driving, and a resistor 260 including a transistor.

The circuit configuration may be provided with a peripheral circuit such as a word line selection circuit 251 (Row Decoder) or a bit line selection circuit 252 (Column Decoder), as appropriate.

The memory cell array 253 includes a first transistor 211 in which one memory cell is provided over a substrate including a semiconductor material, a second transistor 212 including an oxide semiconductor layer, and a capacitor 213. A first gate terminal of the first transistor 211 is electrically connected to a word line 217, a first source terminal of the first transistor 211 is electrically connected to a bit line 214, and a first drain terminal of the first transistor 211 is electrically connected to a source line. A second gate terminal of the second transistor 212 is electrically connected to a word line 216 for an oxide semiconductor, a second source terminal of the second transistor 212 is electrically connected to a bit line 215 for an oxide semiconductor, and a second drain terminal of the second transistor 212 is electrically connected to the first gate terminal of the first transistor 211. The capacitor 213 is electrically connected between the first gate terminal of the first transistor 211 and the word line 217.

A plurality of the memory cells is arranged in m rows (in a vertical direction) and n columns (in a horizontal direction) (both m and n are natural numbers greater than or equal to 1).

Here, as the second transistor 212, a transistor including an oxide semiconductor can be used, for example. A transistor including an oxide semiconductor has a feature of a significantly small off-state current. For that reason, a potential of the first gate electrode of the first transistor 211 can be held for an extremely long time by turning off the second transistor 212. By providing the capacitor 213, holding of charge applied to the first gate electrode of the first transistor 211 and reading of data held can be performed more easily.

Note that there is no particular limitation on the first transistor 211. In terms of increasing the speed of reading data, it is preferable to use a transistor with high switching speed such as a transistor formed using single crystal silicon, for example.

Next, in the verification operation, the potential comparison circuit 254 compares a reference potential from the reference potential circuit 250 and a potential from the memory cell array 253, and provides an output to the control circuit 259.

The control circuit 259 sends signals to a power supply control circuit 257 (Bias Controller) having a function of gradually increasing a potential and various associated circuits (the word line selection circuit 251, the bit line selection circuit 252, the potential comparison circuit 254, the power supply control circuit 257, and the like), and includes a state transition circuit 258 (Finite State Machine: FSM) used for controlling the writing operation, the verification operation, and the reading operation.

The control circuit 259 includes an output 255 (Output (including VERIFY_OUT and READ_OUT) from the potential comparison circuit 254, a latch circuit 256 which can hold data, and the power supply control circuit 257. The power supply control circuit 257 controls power supply voltage VDD using a signal from the latch circuit 256.

Next, the resistor 260 functions by being applied with a signal from the state transition circuit 258 (FSM), and includes a third gate electrode to which the power supply voltage VDD is applied, a third source electrode to which the power supply voltage VDD is applied, a fourth gate electrode which is electrically connected to the state transition circuit 258 (FSM), and a third drain electrode which is electrically connected to the bit line 214 of the memory cell array 253.

Since the resistor 260 includes two gate electrodes (the third gate electrode and the fourth gate electrode), the resistor 260 is also referred to as a so-called dual-gate transistor.

The circuit configuration in FIG. 1 is formed as described above, and data can be held in the memory cell array 253. Specifically, the semiconductor device utilizes a feature in which the potential of the first gate electrode of the first transistor 211 can be held, and can thus write, verify, hold, and read data as follows. The dual-gate transistor of the resistor 260 is utilized, whereby a circuit size is reduced and the verification operation and reading of data can be performed.

<Driving Method>

Next, a specific driving method using the circuit configuration in FIG. 1 will be described below.

First, writing of data and the verification operation will be described. Writing of data and the verification operation are performed at the same time and function using a signal from the state transition circuit 258.

In the writing of data, a potential is supplied to the word line 216 for the oxide semiconductor, and the second transistor 212 is turned on. Accordingly, a potential of the bit line 215 for the oxide semiconductor is supplied to the first gate electrode of the first transistor 211 and the capacitor 213. Note that the potential of the bit line 215 for the oxide semiconductor is gradually increased by the power supply control circuit 257 (Bias Controller). In this manner, a potential of a node 203 (that is, a node FG, and also referred to as a storage node) connected to the first gate electrode of the first transistor 211 is also gradually increased, and current flowing through the first transistor 211 is also gradually increased.

In the verification operation, a positive potential is supplied to the fourth gate electrode of the resistor 260 by a signal from the state transition circuit 258, and a potential of the power supply voltage VDD is supplied to the bit line 214. Then, current flowing through the first transistor 211 from the bit line 214 is monitored, and the potential of the bit line 215 for the oxide semiconductor is continuously gradually increased until the potential of the bit line 215 for the oxide semiconductor reaches a reference potential output from the reference potential circuit 250. A comparison with the reference potential is performed in the potential comparison circuit 254.

Note that the positive potential is supplied to the fourth gate electrode of the resistor 260, so that the threshold value (Vth) of the transistor shift to a negative direction, and the current from the power supply voltage VDD easily flows. In other words, in the case where the transistor is considered as a resistor, the resistor 260 has low resistance. The resistor can be formed with a circuit using a switch, but such a resistor is not preferable because the circuit size is increased.

Here, the operation of the dual-gate transistor used as the resistor 260 will be described with reference to FIG. 2.

Figure 2:
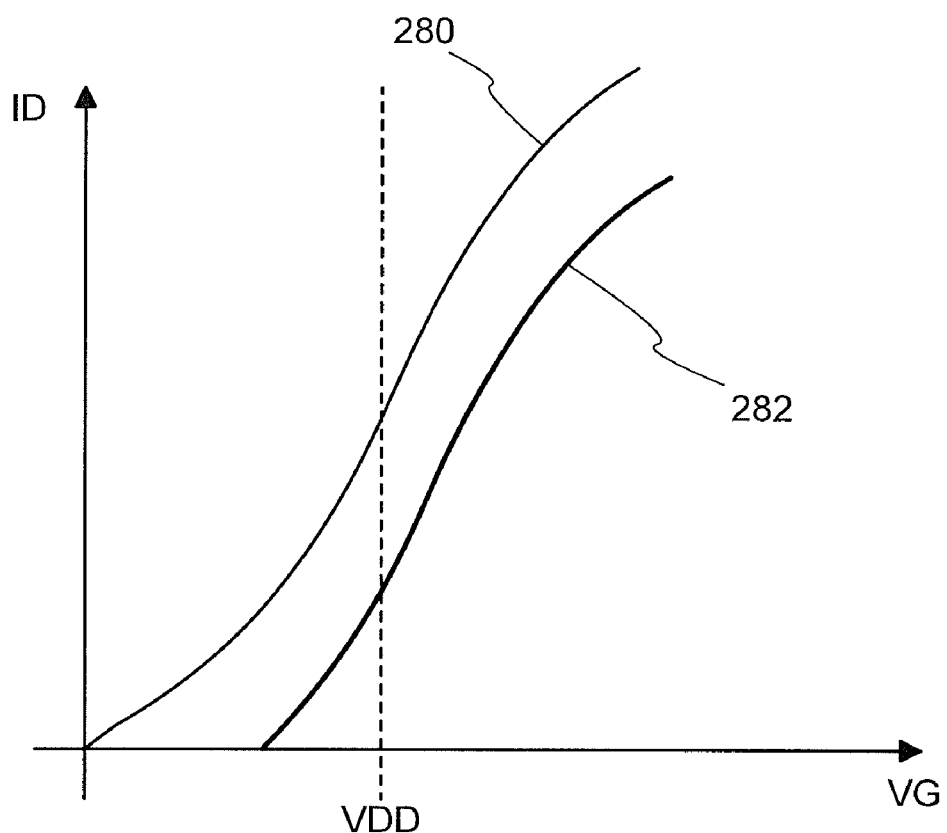
FIG. 2 shows a calculation result of characteristics of a transistor.

FIG. 2 shows calculation results of the dual-gate transistor. The vertical axis represents current ID flowing through the transistor on a log scale, and the horizontal axis represents voltage of the third gate electrode on a linear scale (a curve is also referred to as an ID-VG curve). A solid line 280 shows characteristics of the transistor when the positive potential is supplied to the fourth gate electrode, and a solid line 282 shows characteristics of the transistor when a potential is not supplied to the fourth gate electrode. When the positive potential is supplied to the fourth gate electrode, the threshold (Vth) of the transistor shifts in the negative direction. In other words, in the case where the power supply voltage VDD has a fixed value, higher current flows when the positive potential is supplied to the fourth gate electrode than when the potential is not supplied thereto.

Since current flowing through the first transistor 211 is verified in writing, it is preferable that a negative potential is supplied to an unselected word line in order to prevent false writing to the unselected word line and the false verification operation. Specifically, the writing voltage of the unselected word line and the reading voltage of the unselected word line can each have a potential of −3 V.

Next, holding of data will be described. When current flowing through the first transistor 211 reaches the reference potential (that is, when correct judgment is made by the verification operation), the state transition circuit 258 transmits a signal with which a potential of the word line 216 for the oxide semiconductor is turned off. Accordingly, charge applied to the first gate electrode of the first transistor 211 is held.

Next, reading of data will be described. Operation of reading is performed by a signal of the state transition circuit 258. The state transition circuit 258 does not supply a potential to the fourth gate electrode of the resistor 260. In other words, the resistor 260 has the characteristics of the transistors shown by the solid line 282 in FIG. 2 and has high resistance.

Then, when an appropriate potential (reading potential) is supplied to the word line 217 connected to one electrode of the capacitor 213 while a predetermined potential (fixed potential) is supplied to the bit line 214, the source current of the first transistor 211 or the drain current thereof has a different potential in accordance with the amount of charge held by the first gate electrode of the first transistor 211. For example, in the case where the amount of charge held is large, current flowing through the first transistor 211 is large; therefore, a node 204 (V_MEM) has a low potential input to the potential comparison circuit 254.

Note that the resistor 260 in reading has high resistance because charge is not applied to the fourth gate electrode; thus, reading of data can be performed at a potential which is lower than that in verification.

As described above, it is possible to perform the writing of data to the memory cell array 253, the verification operation, the holding of data, and the reading of data.

Figure 3:
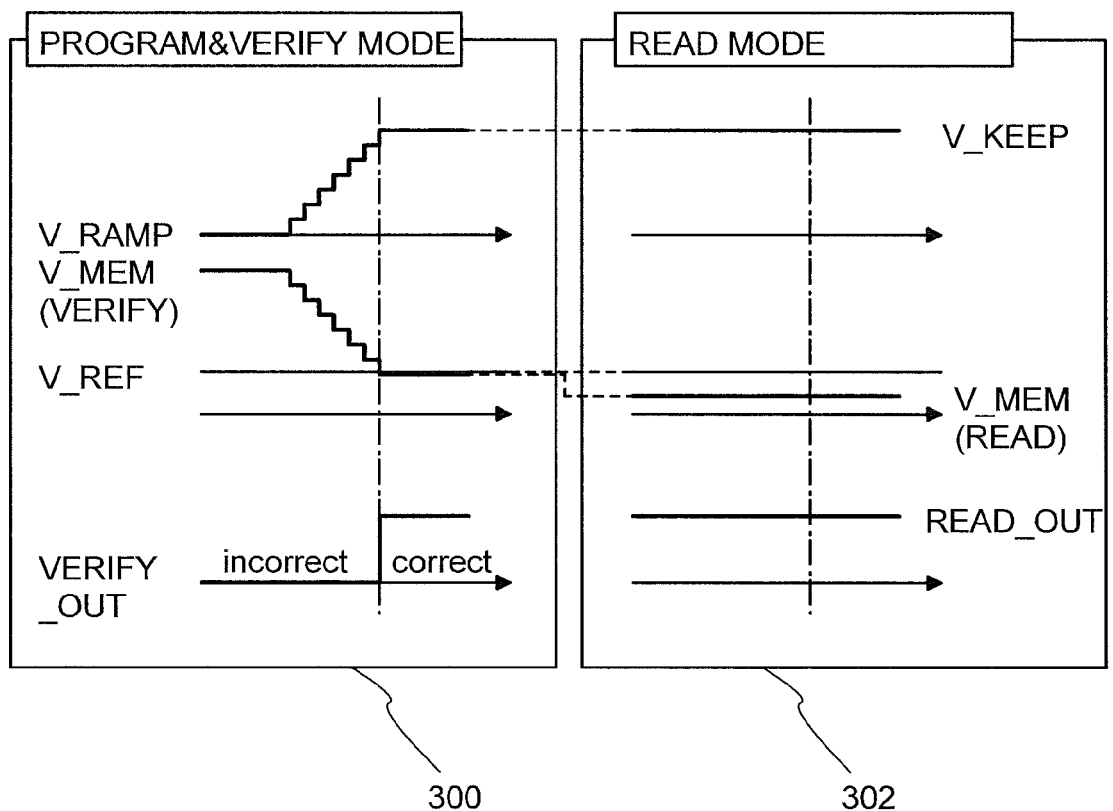
FIGS. 3A and 3B are timing diagrams.

Here, FIGS. 3A and 3B illustrate timing diagrams of each output in verification and in reading.

FIGS. 3A and 3B illustrate a timing diagram 300 showing writing and the verification operation, and a timing diagram 302 showing the operation in reading. Here, in the timing diagrams in FIGS. 3A and 3B, V_RAMP denotes the writing voltage (potential); V_KEEP denotes the potential of the node 203 (node FG), V_REF denotes the reference potential, V_MEM (VERIFY) denotes the potential of the node 204 in verification (potential of the memory cell array 253), V_MEM (READ) denotes the potential of the node 204 in reading (potential of the memory cell array 253), VERIFY_OUT denotes the judgment result in verification, and READ_OUT denotes the judgment result in reading.

In writing, the writing voltage (V_RAMP) is gradually increased, and the potential (V_KEEP) held in the node 203 is also gradually increased. In the verification operation which starts at the same time as in writing, first, the positive potential is applied to the fourth gate electrode of the resistor 260, so that the resistor 260 has low resistance. Next, as the potential (V_KEEP) held in the node 203 increases, the current flowing through the first transistor 211 increases; therefore, the potential of the node 204 (V_MEM (VERIFY)) is gradually decreased, and the writing potential has a fixed value when the reference potential (V_REF) is satisfied. Then, the supply of the writing voltage (V_RAMP) is stopped. In contrast, the potential V_KEEP of the node 203 holds a fixed value after the supply of the writing voltage (V_RAMP) is stopped.

When the reference potential (V_REF) is satisfied, the judgment result (VERIFY_OUT, corresponding to the output 255) repeats judgment in which correct writing is performed (correct).

In contrast, in reading, the supply of the writing voltage (V_RAMP) is stopped, and the amount of charge held at the potential (V_KEEP) of the node 203 of the first transistor 211 is read. The power supply voltage VDD at this time has the same potential as that in the verification operation. However, the positive potential is not supplied to the fourth gate electrode of the resistor 260. In other words, the resistor 260 has high resistance. Therefore, reading of data can be performed at the potential (V_MEM (READ)) of the node 204 in reading which is lower than that in verification.

Note that in the case where the potential (V_MEM (READ)) of the node 204 satisfies the reference potential (V_REF), the judgment result (READ_OUT) in reading is correctly read.

In this manner, in verification and in reading, the power supply voltage VDD has a different value by the resistor 260. In other words, only the reference potential circuit 250 has a function which is in appearance similar to a function of a structure including two kinds of the reference potential circuits 250. Accordingly, the number of the reference potential circuits 250 is not increased; therefore, the circuit size can be reduced.

Note that there is no particular limitation on the transistor used for the resistor 260. However, the transistor used for the resistor 260 is preferably formed at the same time as the manufacturing process of either the first transistor formed over a semiconductor substrate or the second transistor including an oxide semiconductor, because the transistor used for the resistor 260 can be formed without an increase in the number of steps.

Next, rewriting of data will be described. Rewriting of data is performed in a manner similar to that of the writing and holding of data. In other words, the potential of the word line 216 for the oxide semiconductor is set to a potential at which the second transistor 212 is turned on, so that the second transistor 212 is turned on. Accordingly, the potential of the bit line 215 for the oxide semiconductor (a potential for new data) is supplied to the first gate electrode of the first transistor 211 and to the capacitor 213. In a manner similar to that in writing, the potential of the bit line 215 for the oxide semiconductor is also gradually increased, current flowing through the first transistor 211 is monitored, and the potential of the bit line 215 for the oxide semiconductor is continuously gradually increased until the potential of the bit line 215 for the oxide semiconductor reaches a potential set in advance. After the potential of the bit line 215 for the oxide semiconductor becomes the reference potential, the potential of the word line 216 for the oxide semiconductor is set to a potential at which the second transistor 212 is turned off. Accordingly, the first gate electrode of the first transistor 211 is supplied with charge for new data, whereby data is rewritten.

In the semiconductor device according to one embodiment of the invention disclosed herein, data can be directly rewritten by another data writing operation as described above. Therefore, extraction of charge from a floating gate with the use of a high voltage which is necessary for a flash memory or the like is not needed, and thus a decrease in operation speed due to erasing operation can be suppressed. In other words, high-speed operation of the semiconductor device can be realized. The reading potential is verified during writing operation, and the writing potential is gradually increased until the reading potential reaches the reference potential, whereby the false writing can be prevented; and different power supply voltages are used for the reference potential in verification and in reading, whereby stable reading of data can be performed.

Note that the second drain electrode of the second transistor 212 is electrically connected to the first gate electrode of the first transistor 211 and therefore has a function similar to that of a floating gate of a floating gate transistor used for a nonvolatile memory element. Therefore, the node 203 in FIG. 1 where the second drain electrode of the second transistor 212 and the first gate electrode of the first transistor 211 are electrically connected to each other is called a floating gate (FG) in some cases. When the second transistor 212 is turned off, the floating gate (FG) can be regarded as being embedded in an insulator and thus charge is held at the floating gate (FG). The off-state current of the second transistor 212 including an oxide semiconductor is smaller than or equal to $1/100000$ of the off-state current of a transistor including a silicon semiconductor or the like; thus, loss of the charge accumulated in the floating gate (FG) due to leakage in the second transistor 212 is negligible. In other words, with the second transistor 212 including an oxide semiconductor, a nonvolatile memory device which can hold data without being supplied with power can be realized.

For example, when the off-state current of the second transistor 212 at room temperature (25° C.) is 10 zA (1 zA (zeptoampere) is $1 \times 10^{-21}$ A) or less and the capacitance of the capacitor 213 is approximately 10 fF, data can be held for $10^4$ seconds or longer. It is needless to say that the holding time changes depending on characteristics of the transistor and capacitance.

Further, in this case, there is not the problem of deterioration of a gate insulating film (a tunnel insulating film), which is a problem of a conventional floating gate transistor. That is, the problem of deterioration of a gate insulating film due to injection of electrons into a floating gate, which is a conventional problem, can be solved. This means that there is no limit on the number of writing operations in principle. Furthermore, a high voltage needed for writing or erasing of data in a conventional floating gate transistor is not necessary.

In the semiconductor device described in this embodiment, the floating gate (FG) has a function similar to that of a floating gate of a floating gate transistor of a flash memory or the like, but the floating gate (FG) of this embodiment has a feature which is essentially different from that of the floating gate of the flash memory or the like. In the case of a flash memory, since a high voltage is applied to a control gate, it is necessary to keep a proper distance between cells in order to prevent the potential of the control gate from affecting a floating gate of an adjacent cell. This is one factor inhibiting higher integration of the semiconductor device. The factor is attributed to a basic principle of a flash memory, in which a tunneling current is generated by applying a high electric field.

On the other hand, the semiconductor device according to this embodiment is operated by switching of a transistor including an oxide semiconductor and does not use the above-described principle of charge injection by a tunneling current. In other words, a high electric field for charge injection is not necessary, unlike a flash memory. Accordingly, it is not necessary to consider an influence of a high electric field from a control gate on an adjacent cell, and this facilitates an increase in the degree of integration.

In addition, the semiconductor device according to this embodiment is advantageous over a flash memory also in that a high electric field is not necessary and a large peripheral circuit (such as a step-up circuit) is not necessary. For example, the highest voltage applied to the memory cell according to this embodiment (the difference between the highest potential and the lowest potential applied to respective terminals of the memory cell at the same time) can be 5 V or less, preferably 3 V or less, in each memory cell in the case where data of two stages (one bit) is written.

A combination of such structures enables the semiconductor device according to one embodiment of the invention disclosed herein to have further higher integration.

Further, in the semiconductor device according to this embodiment, the dual-gate transistor is used as a resistor between the power supply voltage VDD and the memory circuit. Accordingly, the resistor is used according to whether verification is performed or reading is performed, and the reference potential can have different power supply voltages VDD. With such a structure, two kinds of reference potential circuits for verification and for reading do not need to be provided, so that the circuit size can be reduced.

Note that an n-channel transistor in which electrons are majority carriers is used in the above description; it is needless to say that a p-channel transistor in which holes are majority carriers can be used instead of the n-channel transistor.

As described above, a holding potential is adjusted so that desired data can be obtained in each cell; therefore, writing, verification, and reading in which variation in characteristics of the transistors in each cell are absorbed can be performed. Accordingly, reliability of writing and reading of data as a memory is greatly improved.

The configurations, methods, and the like described in this embodiment can be combined as appropriate with any of the configurations, methods, and the like described in the other embodiments.

Embodiment 2

Next, a circuit configuration which is different from the circuit configuration illustrated in FIG. 1 and a driving method thereof will be described with reference to FIG. 4, FIGS. 5A and 5B, FIGS. 6A and 6B, FIGS. 7A and 7B, and FIGS. 8A and 8B.

Application Example

Figure 4:
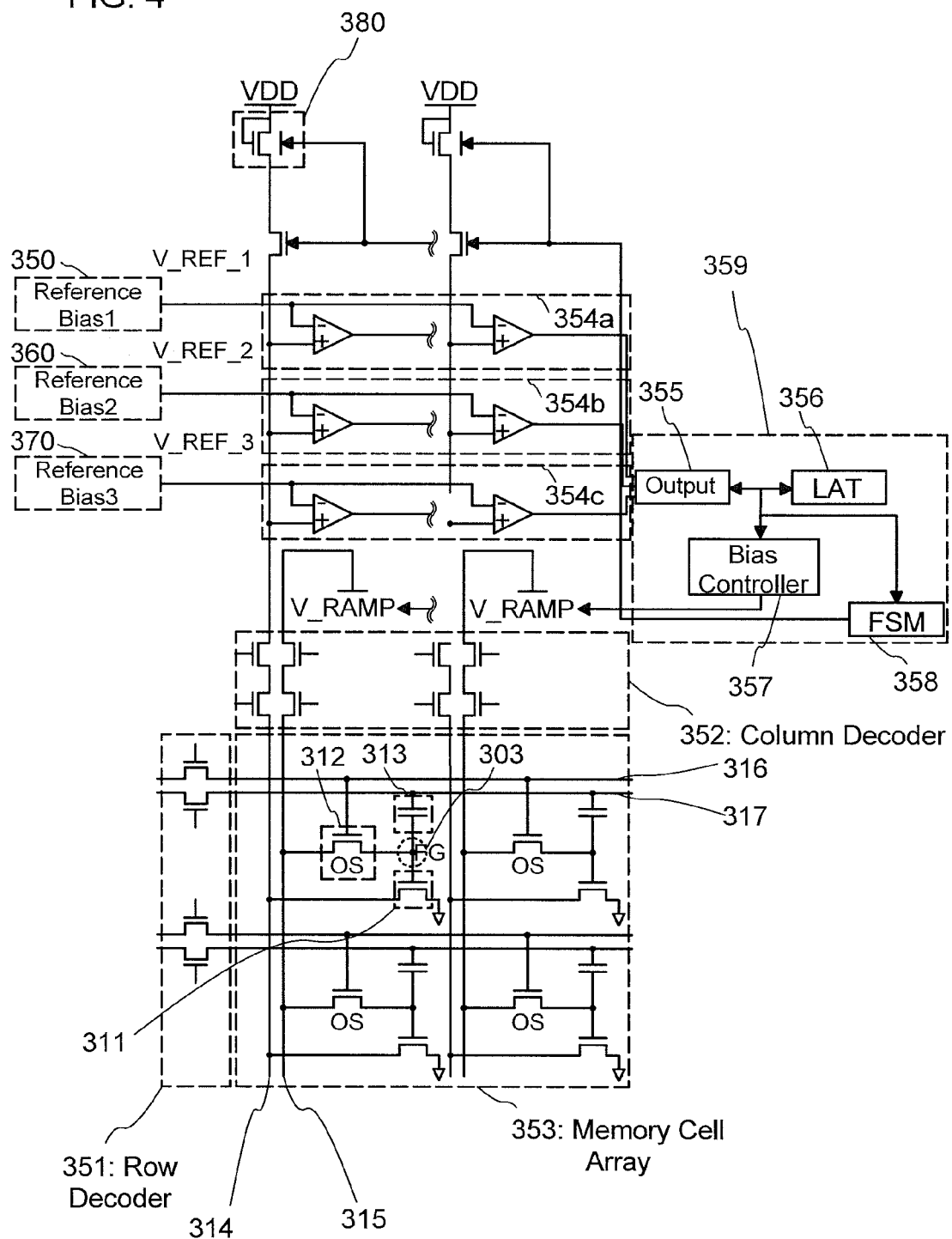
FIG. 4 is a circuit diagram of a semiconductor device.

A difference between FIG. 1 and FIG. 4 is that the circuit configuration illustrated in FIG. 1 is the 1 bit/cell whereas the circuit configuration illustrated in FIG. 4 is a multilevel memory circuit of a 2 bit/cell.

The multilevel memory circuit in FIG. 4 includes a reference potential circuit 350 (Reference Bias 1) which transmits a signal of a reference potential, a reference potential circuit 360 (Reference Bias 2), a reference potential circuit 370 (Reference Bias 3), a word line selection circuit 351 (Row Decoder) which selects/controls an address of a word line, a bit line selection circuit 352 (Column Decoder) which selects/controls an address of a bit line, a memory cell array 353 which stores data, a potential comparison circuit 354a which compares a reference potential output from the reference potential circuit 350 and a potential of the memory cell array 353, a potential comparison circuit 354b which compares a reference potential output from the reference potential circuit 360 and the potential of the memory cell array 353, a potential comparison circuit 354c which compares a reference potential output from the reference potential circuit 370 and the potential of the memory cell array 353, a control circuit 359 which can perform control and confirmation, and a resistor 380 which changes a potential from the power supply voltage VDD.

The control circuit 359 includes a latch circuit 356 (LAT) which can hold an output 355 (Output) corresponding to the logical sum of outputs from the potential comparison circuit 354a, the potential comparison circuit 354b, and the potential comparison circuit 354c; a potential control circuit 357 (Bias Controller) which controls a potential by a signal from the latch circuit 356; and a state change circuit 358 (FSM) which realizes control.

The resistor 380 has a function similar to that of the resistor 260 in FIG. 1, and is a dual-gate transistor including a third gate electrode to which the power supply voltage VDD is applied, a third source electrode to which the power supply voltage VDD is applied, a fourth gate electrode electrically connected to the state change circuit 358 (FSM), and a third drain electrode electrically connected to a first bit line 314 of the memory cell array 353.

Further, one memory cell includes a first transistor 311, a second transistor 312, a capacitor 313, the first bit line 314, a first bit line 315 for an oxide semiconductor, a first word line 316 for an oxide semiconductor, and a first word line 317, and a plurality of the memory cells is included in the memory cell array 353. In addition, a connection point of a drain electrode of the second transistor 312, a gate electrode of the first transistor 311, and one electrode of the capacitor 313 is denoted by a node 303 (node FG).

In the structure of the multilevel memory circuit in FIG. 4, it is necessary to divide the holding voltage into four values; therefore, three kinds of reference potential circuits each of which transmits a signal of the reference potential are needed. At the same time, potential comparison circuits which compare the reference potentials output from their respective reference potential circuits are also needed in accordance with the reference potential circuits.

The driving method of the circuit configuration illustrated in FIG. 4 will be described with reference to the timing diagrams of FIGS. 5A and 5B, FIGS. 6A and 6B, FIGS. 7A and 7B, and FIGS. 8A and 8B. Note that in the timing diagrams of FIGS. 5A and 5B, FIGS. 6A and 6B, FIGS. 7A and 7B, and FIGS. 8A and 8B, the same reference numerals as those in the timing diagrams in FIGS. 3A and 3B have similar functions, and repetitive description will be omitted.

In FIGS. 5A and 5B, FIGS. 6A and 6B, FIGS. 7A and 7B, and FIGS. 8A and 8B, V_RAMP denotes writing voltage, V_KEEP denotes a potential of the node 303 (node FG), V_REF denotes a reference potential, V_MEM (VERIFY) denotes the potential of the memory cell array 353 in verification, V_MEM (READ) denotes the potential of the memory cell array 353 in reading, VERIFY_OUT denotes a judgment result in verification, and READOUT denotes a judgment result in reading.

Note that when the judgment result (VERIFY_OUT) satisfies "1", the reference potentials vary between the reference potential circuits. Therefore, the judgment result (VERIFY_OUT) is determined in such a manner that any of the reference potentials of the reference potential circuit 350 (Reference Bias 1), the reference potential circuit 360 (Reference Bias 2), and the reference potential circuit 370 (Reference Bias 3) is confirmed/judged.

The timing diagrams in FIGS. 5A and 5B illustrate the case where the reference potential satisfies data="00". Note that FIG. 5A illustrates the timing diagram of the writing and the verification operation, and FIG. 5B illustrates the timing diagram of the reading operation.

At the time A of FIG. 5A, before the writing voltage (V_RAMP) is increased, V_MEM (VERIFY) has already satisfied the reference potential (V_REF); therefore, a signal (correct) which matches the reference potential (V_REF) is transmitted as the judgment result (VERIFY_OUT) to the potential control circuit 357 (Bias Controller), and the writing voltage is held. In other words, before the writing voltage (V_RAMP) is increased, a matched signal (correct) is output; therefore, the writing voltage (V_RAMP) is not increased.

In reading illustrated in FIG. 5B, V_MEM (READ) is read at a potential lower than V_MEM (VERIFY). This means that a low resistance and a high resistance of the resistor 380 are used according to whether verification is performed or reading is performed. In other words, a positive potential is supplied to the fourth gate electrode of the dual-gate transistor functioning as the resistor 380 by the signal from the state change circuit 358 in verification, and a potential is not supplied to the fourth gate electrode in reading.

Figures 6A, 6B:
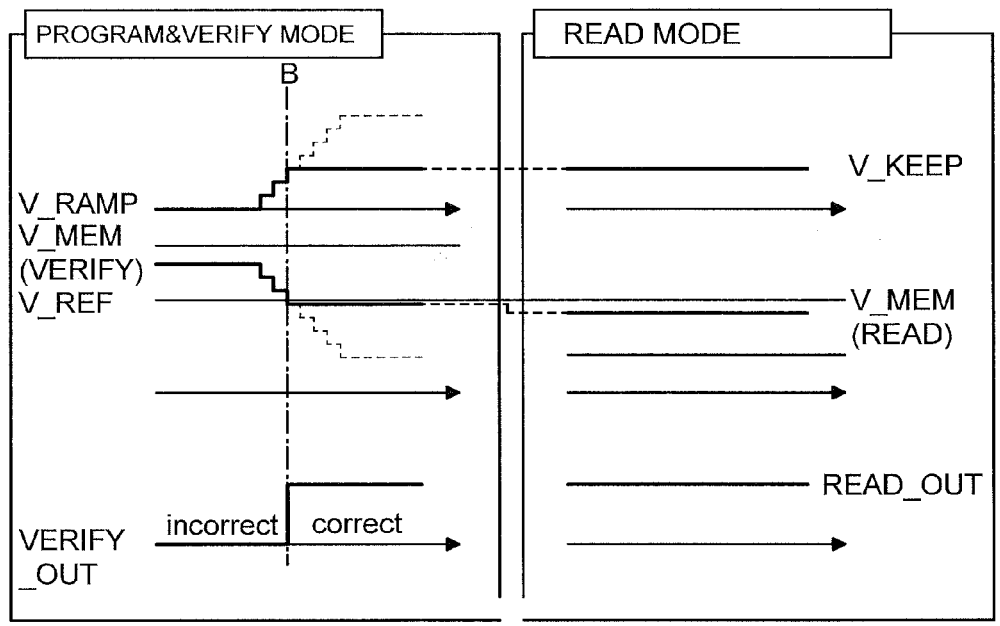
FIGS. 6A and 6B are timing diagrams.

Next, the timing diagrams in FIGS. 6A and 6B illustrate the case where the reference potential satisfies data="01". Note that FIG. 6A illustrates a timing diagram of the writing and the verification operation, and FIG. 6B illustrates a timing diagram of the reading operation.

At the time B of FIG. 6A, when the writing voltage (V_RAMP) is gradually increased and V_MEM (VERIFY) satisfies the reference potential (V_REF), a signal (correct) which matches the reference potential (V_REF) is transmitted as the judgment result (VERIFY_OUT) to the potential control circuit 357 (Bias Controller), and the potential of V_KEEP (node 303 (node FG)) is held.

In reading illustrated in FIG. 6B, V_MEM (READ) is read at a potential lower than V_MEM (VERIFY). This means that the low resistance and the high resistance of the resistor 380 are used according to whether verification is performed or reading is performed. In other words, the positive potential is supplied to the fourth gate electrode of the dual-gate transistor functioning as the resistor 380 by the signal from the state change circuit 358 in verification, and the potential is not supplied to the fourth gate electrode in reading.

Next, the timing diagrams in FIGS. 7A and 7B illustrate the case where the reference potential satisfies data="10". Note that FIG. 7A illustrates the timing diagram of the writing and the verification operation, and FIG. 7B illustrates the timing diagram of the reading operation.

At the time C of FIG. 7A, when the writing voltage (V_RAMP) is gradually increased and V_MEM (VERIFY) satisfies the reference potential (V_REF), a signal (correct) which matches the reference potential (V_REF) is transmitted as the judgment result (VERIFY_OUT) to the potential control circuit 357 (Bias Controller), and the potential of V_KEEP (node 303 (node FG)) is held.

In reading illustrated in FIG. 7B, V_MEM (READ) is read at a potential lower than V_MEM (VERIFY). This means that the low resistance and the high resistance of the resistor 380 are used according to whether verification is performed or reading is performed. In other words, the positive potential is supplied to the fourth gate electrode of the dual-gate transistor functioning as the resistor 380 by the signal from the state change circuit 358 in verification, and the potential is not supplied to the fourth gate electrode in reading.

Figures 8A, 8B:
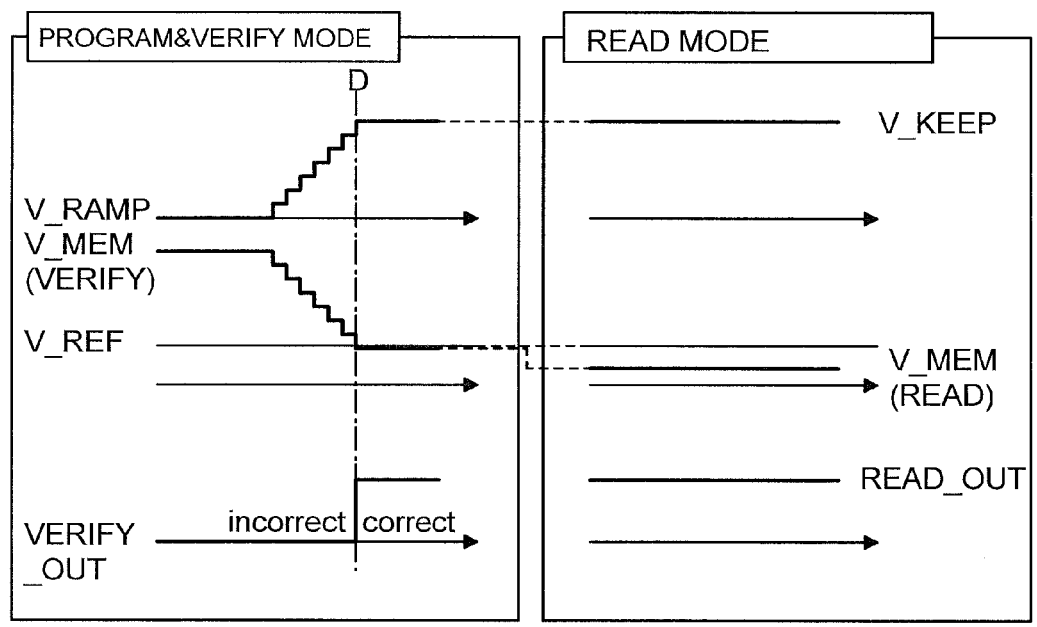
FIGS. 8A and 8B are timing diagrams.

The timing diagrams in FIGS. 8A and 8B illustrate the case where the reference potential satisfies data="11". Note that FIG. 8A illustrates the timing diagram of the writing and the verification operation, and FIG. 8B illustrates the timing diagram of the reading operation.

At the time D of FIG. 8A, when the writing voltage (V_RAMP) is gradually increased and V_MEM (VERIFY) satisfies the reference potential (V_REF), a signal (correct) which matches the reference potential (V_REF) is transmitted as the judgment result (VERIFY_OUT) to the potential control circuit 357 (Bias Controller), and the potential of V_KEEP (node 303 (node FG)) is held.

In reading illustrated in FIG. 8B, V_MEM (READ) is read at a potential lower than V_MEM (VERIFY). This means that the low resistance and the high resistance of the resistor 380 are used according to whether verification is performed or reading is performed. In other words, the positive potential is supplied to the fourth gate electrode of the dual-gate transistor functioning as the resistor 380 by the signal from the state change circuit 358 in verification, and the potential is not supplied to the fourth gate electrode in reading.

As described above, reading is performed while the writing voltage (V_RAMP) is increased; data can be written at a set potential even in the case where the first transistor 311 which is a reading transistor and the second transistor 312 which is a writing transistor have variation in characteristics.

Further, the semiconductor device according to this embodiment can perform writing in which variation in characteristics of the transistors in each memory cell are suppressed because the holding potential is adjusted so that desired data can be obtained in each memory cell.

In addition, in the semiconductor device according to this embodiment, the dual-gate transistor is used as the resistor between the power supply voltage VDD and the memory circuit. Accordingly, the resistor can be used according to whether verification is performed or reading is performed, and different power supply voltages VDD in accordance with the reference potentials can be provided. With such a structure, it is not necessary to provide two kinds of reference potential circuits, that is, a reference potential circuit for verification and a reference potential circuit for reading, the circuit size can be reduced, and reading of data with a margin can be performed.

The configurations, methods, and the like described in this embodiment can be combined as appropriate with any of the configurations, methods, and the like described in the other embodiments.

Embodiment 3

In this embodiment, a structure and a manufacturing method of a semiconductor device according to one embodiment of the invention disclosed herein will be described with reference to FIGS. 9A and 9B, FIGS. 10A to 10D, FIGS. 11A to 11D, FIGS. 12A to 12D, and FIGS. 13A to 13C.

<Cross-Sectional Structure and Planar Structure of Semiconductor Device>

Figure 9A:
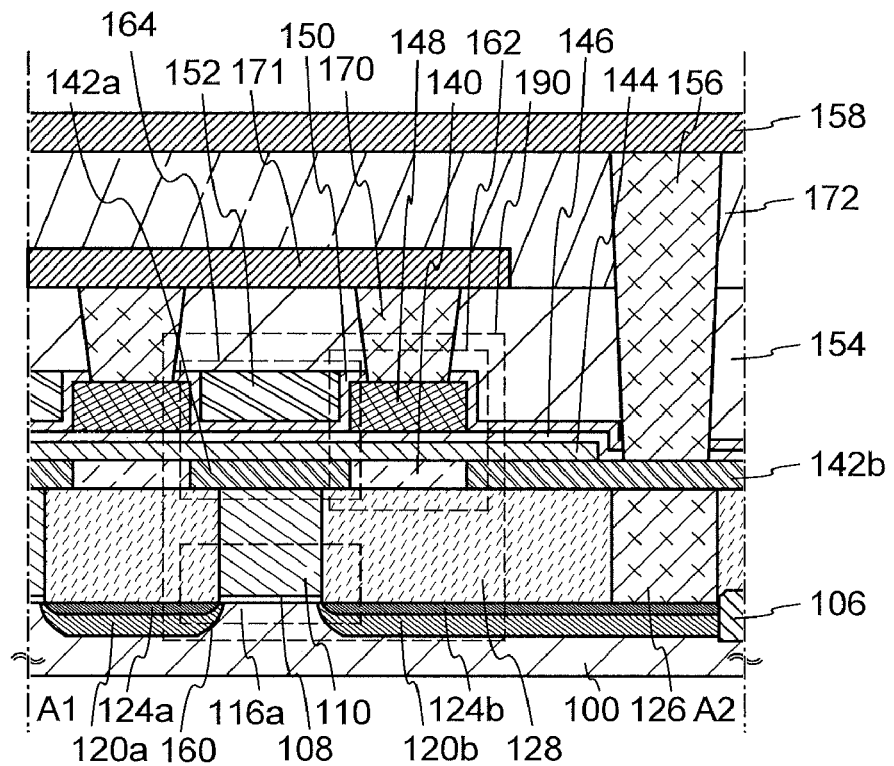
FIGS. 9A and 9B are a cross-sectional view and a plan view of a semiconductor device.
Figure 9B:
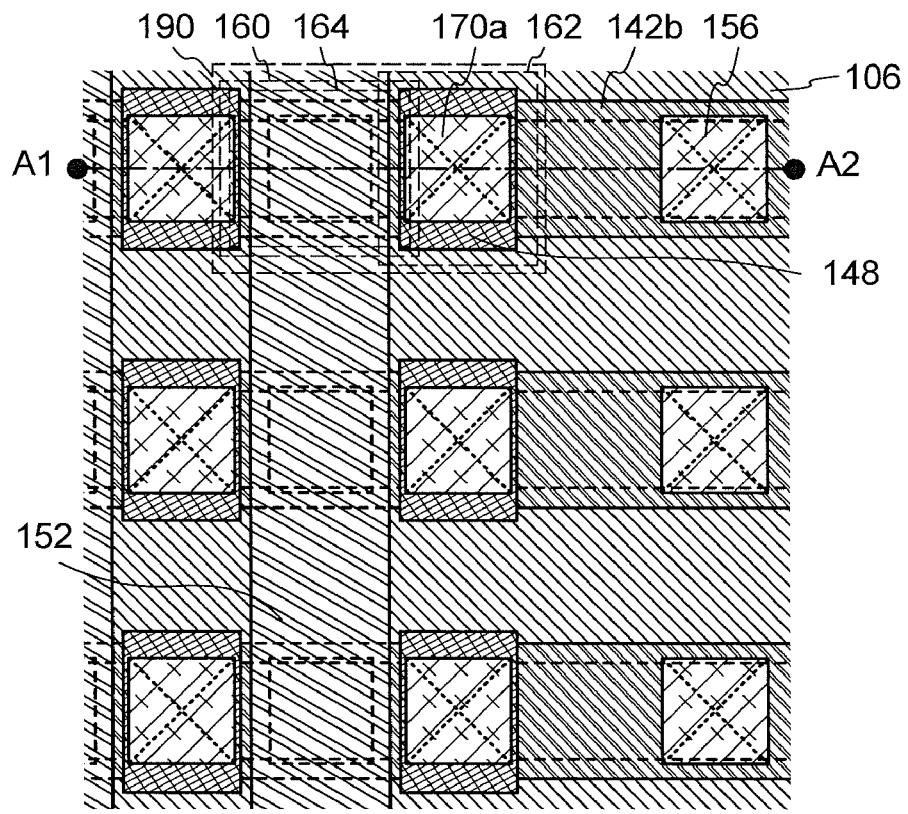

FIGS. 9A and 9B illustrate an example of a structure of a semiconductor device corresponding to the first transistor 211 and the second transistor 212 included in the memory cell array 253 illustrated in FIG. 1 or the first transistor 311 and the second transistor 312 included in the memory cell array 353 illustrated in FIG. 4. FIG. 9A is a cross-sectional view of the semiconductor device, and FIG. 9B is a plan view of the semiconductor device. Here, FIG. 9A corresponds to a cross section along line A1-A2 in FIG. 9B. Note that in FIG. 9B, some of components of the semiconductor device (e.g., an insulating layer 154, an insulating layer 172, a wiring 171, and a wiring 158) are omitted in order to avoid complexity. The semiconductor device illustrated in FIGS. 9A and 9B includes a transistor 160 including a first semiconductor material in a lower portion, and a transistor 162 including a second semiconductor material in an upper portion.

Note that the transistor 160 corresponds to the first transistor 211 and the first transistor 311, whereas the transistor 162 corresponds to the second transistor 212 and the second transistor 312. Further, a memory cell 190 is constituted by the transistor 160, the transistor 162 and a capacitor 164.

Here, the first semiconductor material and the second semiconductor material are preferably different materials. For example, the first semiconductor material can be a semiconductor material (such as silicon) other than an oxide semiconductor, and the second semiconductor material can be an oxide semiconductor. A transistor including a material other than an oxide semiconductor can operate at high speed easily. On the other hand, a transistor including an oxide semiconductor can hold charge for a long time owing to its characteristics.

Although all the above transistors are n-channel transistors in the following description, it is needless to say that p-channel transistors can be used. The technical nature of the invention disclosed herein is to use a semiconductor material with which off-state current can be sufficiently decreased, such as an oxide semiconductor, in the transistor 162 so that data can be held. Therefore, it is not necessary to limit a specific structure of the semiconductor device, such as a material of the semiconductor device or a structure of the semiconductor device, to the structure described here.

The transistor 160 in FIGS. 9A and 9B includes an impurity region 120a and an impurity region 120b provided such that a channel formation region 116a provided in a substrate 100 including a semiconductor material (such as silicon) is sandwiched therebetween, a metal compound region 124a in contact with the impurity region 120a, a metal compound region 124b in contact with the impurity region 120b, a gate insulating layer 108 provided over the channel formation region 116a, and a gate electrode 110 provided over the gate insulating layer 108. Note that a transistor whose source electrode and drain electrode are not illustrated in FIG. 9A may also be referred to as a transistor for the sake of convenience. Further, in such a case, in description of a connection of a transistor, a source region and a source electrode may be collectively referred to as a "source electrode", and a drain region and a drain electrode may be collectively referred to as a "drain electrode". That is, in this specification, the term "source electrode" may include a source region and the term "drain electrode" may include a drain region.

The substrate 100 is provided with an element isolation insulating layer 106 which surrounds the transistor 160. An insulating layer 128 is provided so as to surround the transistor 160. Note that for higher integration, it is preferable that, as in FIGS. 9A and 9B, the transistor 160 does not have a sidewall insulating layer. On the other hand, when the characteristics of the transistor 160 have priority, the sidewall insulating layer may be formed on a side surface of the gate electrode 110 and a region having a different impurity concentration may be provided.

Here, the insulating layer 128 preferably has a surface with favorable planarity; for example, the surface of the insulating layer 128 preferably has a root-mean-square (RMS) roughness of 1 nm or less.

The transistor 162 in FIGS. 9A and 9B includes a source electrode 142a and a drain electrode 142b which are embedded in an insulating layer 140 formed over the insulating layer 128; an oxide semiconductor layer 144 in contact with part of the insulating layer 140, the source electrode 142a, and the drain electrode 142b; a gate insulating layer 146 covering the oxide semiconductor layer 144; and a gate electrode 148 provided over the gate insulating layer 146 so as to overlap with the oxide semiconductor layer 144.

Here, the oxide semiconductor layer 144 is preferably an oxide semiconductor layer which is purified by sufficiently removing an impurity such as hydrogen therefrom or by sufficiently supplying oxygen thereto. Specifically, the hydrogen concentration of the oxide semiconductor layer 144 is $5\times10^{19}$ atoms/cm$^3$ or less, preferably $5\times10^{18}$ atoms/cm$^3$ or less, more preferably $5\times10^{17}$ atoms/cm$^3$ or less, for example. Note that the above hydrogen concentration of the oxide semiconductor layer 144 is measured by secondary ion mass spectrometry (SIMS). The density of carriers generated due to a donor such as hydrogen in the oxide semiconductor layer 144, in which hydrogen is reduced to a sufficiently low concentration so that the oxide semiconductor layer is purified and in which defect states in an energy gap due to oxygen deficiency are reduced by sufficiently supplying oxygen as described above, is less than $1\times10^{12}$/cm$^3$, preferably less than $1\times10^{11}$/cm$^3$, more preferably less than $1.45\times10^{10}$/cm$^3$. In addition, for example, the off-state current (per unit channel width (1 μm), here) at room temperature (25° C.) is 100 zA (1 zA (zeptoampere) is $1\times10^{-21}$ A) or less, preferably 10 zA or less. In this manner, by using an i-type (intrinsic) or substantially i-type oxide semiconductor, the transistor 162 which has extremely favorable off-state current characteristics can be obtained.

In addition, a region which is part of a surface of the insulating layer 140 and is in contact with the oxide semiconductor layer 144 preferably has a root-mean-square (RMS) roughness of 1 nm or less. In this manner, the channel formation region of the transistor 162 is provided in an extremely flat region having a root-mean-square (RMS) roughness of 1 nm or less, whereby the transistor 162 which can prevent a malfunction such as a short-channel effect and has favorable characteristics can be provided even when the transistor 162 is miniaturized.

An insulating layer 150 is provided over the transistor 162, and the insulating layer 154 is provided over the insulating layer 150 and an electrode 152 of the capacitor 164. An opening reaching the gate electrode 148 is formed in the insulating layer 150 and the insulating layer 154, and an electrode 170 is formed in the opening. Over the insulating layer 154, the wiring 171 is formed to be in contact with the electrode 170 formed so as to be embedded in the insulating layer 154; thus, the gate electrode 148 and the wiring 171 are electrically connected to each other. The insulating layer 172 is provided over the insulating layer 154 and the wiring 171.

In an opening formed in the gate insulating layer 146, the insulating layer 150, the insulating layer 154, and the insulating layer 172, an electrode 156 is provided. Over the insulating layer 172, the wiring 158 connected to the electrode 156 is formed. The wiring 158 and the metal compound region 124b functioning as a drain region of the transistor 160 are electrically connected to each other through the electrode 156 provided in the opening formed in the gate insulating layer 146, the insulating layer 150, the insulating layer 154, and the insulating layer 172, through the drain electrode 142b embedded in the insulating layer 140, and through an electrode 126 embedded in the insulating layer 128.

Note that the structure of a semiconductor device according to one embodiment of the invention disclosed herein is not limited to that illustrated in FIGS. 9A and 9B. Since the technical idea of one embodiment of the invention disclosed herein is to form a layered structure with an oxide semiconductor and a material other than an oxide semiconductor, the details such as an electrode connection can be changed as appropriate.

Next, an example of a method for manufacturing the above-described semiconductor device will be described. First, a method for manufacturing the transistor 160 in the lower portion will be described below with reference to FIGS. 10A to 10D and FIGS. 11A to 11D; then, a method for manufacturing the transistor 162 in the upper portion and the capacitor 164 will be described with reference to FIGS. 12A to 12D and FIGS. 13A to 13C.

Figure 10A:
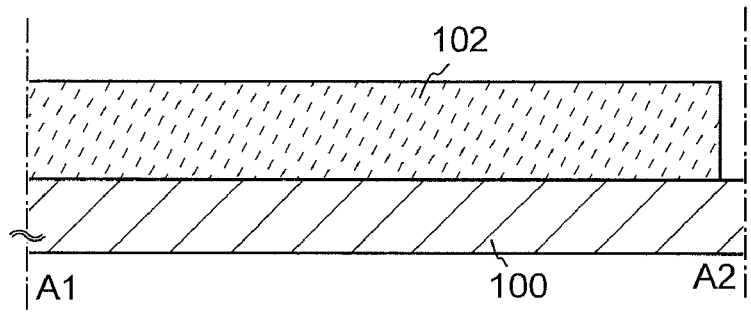
FIGS. 10A to 10D are cross-sectional views of a semiconductor device.
Figure 10B:
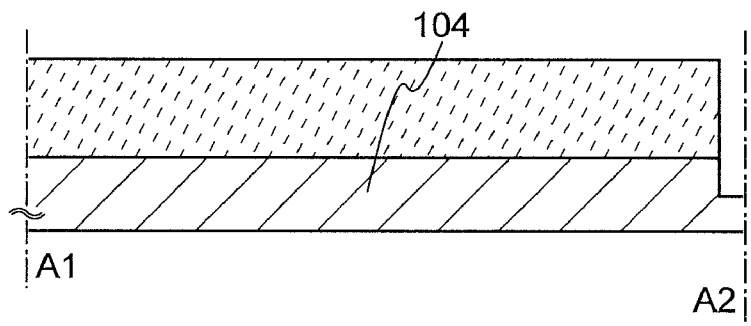

First, the substrate 100 including a semiconductor material is prepared (see FIG. 10A). A single crystal semiconductor substrate or a polycrystalline semiconductor substrate of silicon, silicon carbide, or the like, a compound semiconductor substrate of silicon germanium or the like, an SOI substrate, or the like can be used as the substrate 100 including a semiconductor material. Note that the term "SOI substrate" generally means a substrate where a silicon semiconductor layer is provided on an insulating surface. In this specification and the like, the term "SOI substrate" also means a substrate where a semiconductor layer including a material other than silicon is provided on an insulating surface. That is, a semiconductor layer included in the "SOI substrate" is not limited to a silicon semiconductor layer. Moreover, the SOI substrate can be a substrate having a structure in which a semiconductor layer is provided over an insulating substrate such as a glass substrate, with an insulating layer interposed therebetween.

Here, an example of using a single crystal silicon substrate as the substrate 100 including a semiconductor material is described. It is preferable that a single crystal semiconductor substrate of silicon or the like be particularly used as the substrate 100 including a semiconductor material because the speed of the reading operation of the semiconductor device can be increased.

Note that an impurity element may be added to a region which later functions as a channel formation region 116 of the transistor 160, in order to control the threshold voltage of the transistor. Here, an impurity element imparting conductivity is added so that the threshold voltage of the transistor 160 becomes positive. When the semiconductor material is silicon, the impurity imparting conductivity may be boron, aluminum, gallium, or the like. Note that it is preferable to perform heat treatment after adding the impurity element, in order to activate the impurity element or reduce defects which may be generated during addition of the impurity element.

A protective layer 102 serving as a mask for forming an element isolation insulating layer is foamed over the substrate 100 (see FIG. 10A). As the protective layer 102, an insulating layer formed using a material such as silicon oxide, silicon nitride, silicon oxynitride, or the like can be used, for example.

Next, part of the substrate 100 in a region not covered with the protective layer 102 (i.e., in an exposed region) is removed by etching using the protective layer 102 as a mask. Thus, a semiconductor region 104 isolated from the other semiconductor regions is formed (see FIG. 10B). As the etching, dry etching is preferably performed, but wet etching may be performed. An etching gas or an etchant can be selected as appropriate depending on a material to be etched.

Figure 10C:
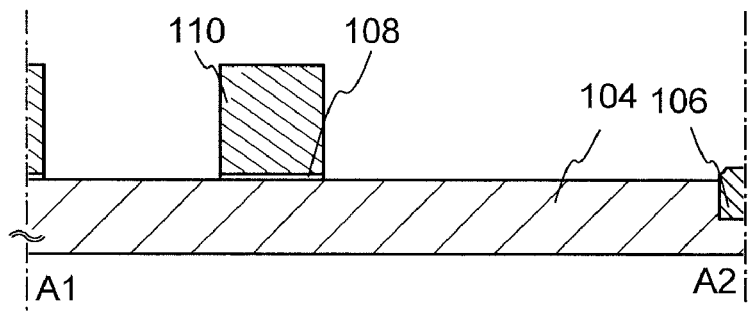

Then, an insulating layer is formed so as to cover the semiconductor region 104, and the insulating layer in a region overlapping with the semiconductor region 104 is selectively removed; thus, the element isolation insulating layer 106 is formed (see FIG. 10C). The insulating layer is formed using silicon oxide, silicon nitride, silicon oxynitride, or the like. As a method for removing the insulating layer, any of etching treatment, polishing treatment such as chemical mechanical polishing (CMP) treatment, and the like can be employed. Note that the protective layer 102 is removed after the formation of the semiconductor region 104 or after the formation of the element isolation insulating layer 106.

Next, an insulating layer is formed over a surface of the semiconductor region 104, and a layer including a conductive material is formed over the insulating layer.

The insulating layer is processed into a gate insulating layer later and can be formed by, for example, heat treatment (thermal oxidation treatment, thermal nitridation treatment, or the like) of the surface of the semiconductor region 104. Instead of heat treatment, high-density plasma treatment may be employed. The high-density plasma treatment can be performed using, for example, a mixed gas of any of a rare gas such as He, Ar, Kr, or Xe, oxygen, nitrogen oxide, ammonia, nitrogen, hydrogen, and the like. It is needless to say that the insulating layer may be formed by a CVD method, a sputtering method, or the like. The insulating layer preferably has a single-layer structure or a layered structure with a film including silicon oxide, silicon oxynitride, silicon nitride, hafnium oxide, aluminum oxide, tantalum oxide, yttrium oxide, hafnium silicate ($HfSi_xO_y$ (x>0, y>0)), hafnium silicate to which nitrogen is added ($HfSi_xO_y$ (x>0, y>0)), hafnium aluminate to which nitrogen is added ($HfAl_xO_y$ (x>0, y>0)), or the like. The insulating layer can have a thickness of greater than or equal to 1 nm and less than or equal to 100 nm, preferably, greater than or equal to 10 nm and less than or equal to 50 nm, for example.

The layer including a conductive material can be formed using a metal material such as aluminum, copper, titanium, tantalum, or tungsten. The layer including a conductive material may be formed using a semiconductor material such as polycrystalline silicon. There is no particular limitation on the method for forming the layer including a conductive material, and a variety of film formation methods such as an evaporation method, a CVD method, a sputtering method, or a spin coating method can be employed. Note that this embodiment shows an example of the case where the layer including a conductive material is fanned using a metal material.

After that, the insulating layer and the layer including a conductive material are selectively etched; thus, the gate insulating layer 108 and the gate electrode 110 are formed (see FIG. 10C).

Figure 10D:
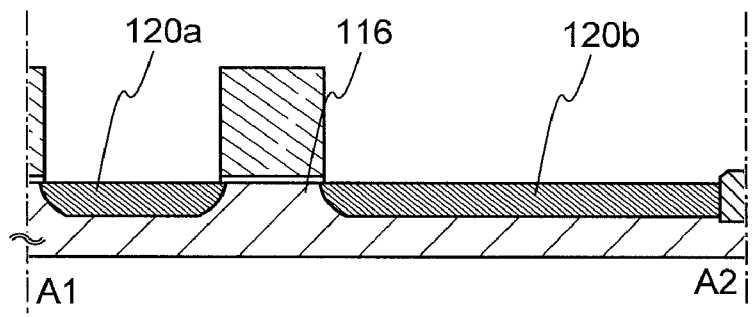

Next, phosphorus (P), arsenic (As), or the like is added to the semiconductor region 104, whereby the channel formation region 116, the impurity region 120a, and the impurity region 120b are formed (see FIG. 10D). Note that phosphorus or arsenic is added here in order to form an n-type transistor; an impurity element such as boron (B) or aluminum (Al) may be added in the case of forming a p-type transistor. Here, the concentration of the impurity added can be set as appropriate;

the concentration is preferably set high when a semiconductor element is highly miniaturized.

Note that a sidewall insulating layer may be formed around the gate electrode 110, and impurity regions to which the impurity element is added at a different concentration may be formed.

Figure 11A:
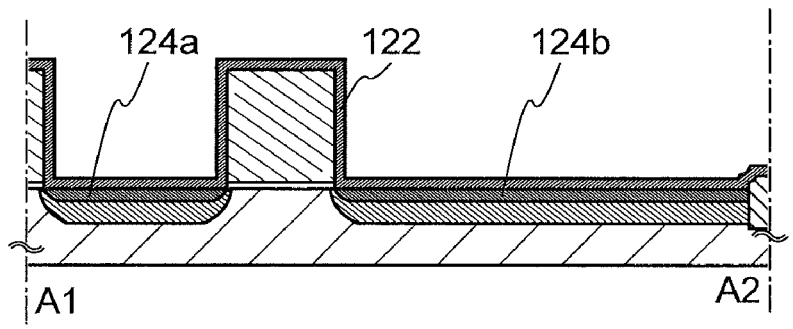
FIGS. 11A to 11D are cross-sectional views of a manufacturing process of a semiconductor device.

Next, a metal layer 122 is formed so as to cover the gate electrode 110, the impurity region 120a, and the impurity region 120b (see FIG. 11A). The metal layer 122 can be formed by a variety of film formation methods such as a vacuum evaporation method, a sputtering method, and a spin coating method. The metal layer 122 is preferably formed using a metal material which forms a low-resistance metal compound by reacting with the semiconductor material contained in the semiconductor region 104. Examples of such metal materials are titanium, tantalum, tungsten, nickel, cobalt, platinum, and the like.

Next, heat treatment is performed so that the metal layer 122 reacts with the semiconductor material. Thus, the metal compound region 124a and the metal compound region 124b which are in contact with the impurity region 120a and the impurity region 120b, respectively are formed (see FIG. 11A). Note that when the gate electrode 110 is formed using polycrystalline silicon or the like, a metal compound region is also formed in a portion of the gate electrode 110 which is in contact with the metal layer 122.

As the heat treatment, irradiation with a flash lamp can be employed, for example. Although it is needless to say that another heat treatment method may be used, a method by which heat treatment can be achieved in an extremely short time is preferably used in order to improve the controllability of chemical reaction for formation of the metal compound. Note that the metal compound region is formed by reaction of the metal material and the semiconductor material and have sufficiently high conductivity. The formation of the metal compound region can properly reduce the electric resistance and improve element characteristics. Note that the metal layer 122 is removed after the metal compound region 124a and the metal compound region 124b are formed.

Figure 11B:
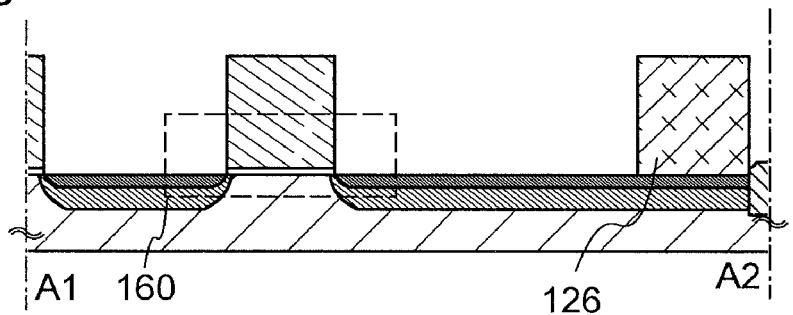

Next, the electrode 126 is formed on and in contact with the metal compound region 124b of the transistor 160 (see FIG. 11B). The electrode 126 is formed by forming a conductive layer by a PVD method such as a sputtering method, or a CVD method such as a plasma-enhanced CVD method, and then by etching the conductive layer into a desired shape. As a material of the conductive layer, an element selected from aluminum, chromium, copper, tantalum, titanium, molybdenum, and tungsten, an alloy including any of these elements as a component, or the like can be used. A material including one of manganese, magnesium, zirconium, beryllium, neodymium, and scandium or a combination of a plurality of these elements may be used.

Through the above steps, the transistor 160 is formed with the use of the substrate 100 including a semiconductor material (see FIG. 11B). A feature of the transistor 160 is that it can operate at high speed. With the use of that transistor as a reading transistor, data can be read at high speed.

Figure 11C:
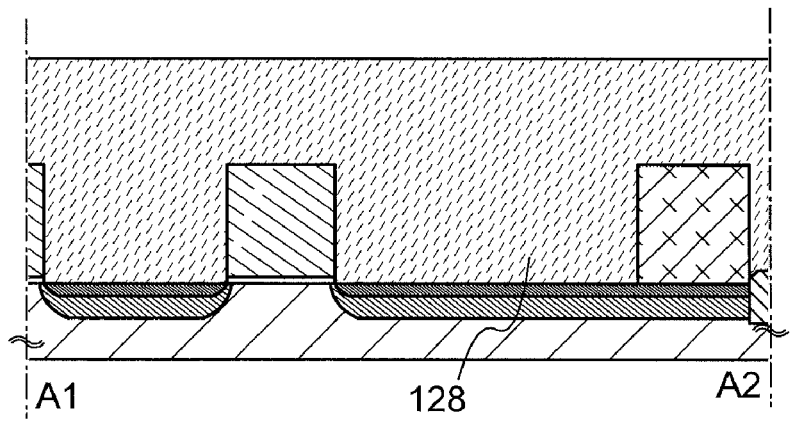

Next, the insulating layer 128 is formed so as to cover the components formed in the above steps (see FIG. 11C). The insulating layer 128 can be foamed using an inorganic insulating material such as silicon oxide, silicon oxynitride, silicon nitride, or aluminum oxide. It is particularly preferable to use a low dielectric constant (low-k) material for the insulating layer 128 because capacitance due to overlap of electrodes or wirings can be sufficiently reduced. Note that a porous insulating layer with such a material may be employed as the insulating layer 128. A porous insulating layer has a lower dielectric constant than an insulating layer with high density, and thus allows a further reduction in capacitance generated by electrodes or wirings. Alternatively, the insulating layer 128 can be formed using an organic insulating material such as polyimide or an acrylic resin. Note that although the insulating layer 128 has a single-layer structure in this embodiment, one embodiment of the invention disclosed herein is not limited to this example. The insulating layer 128 may have a layered structure including two or more layers.

Figure 11D:
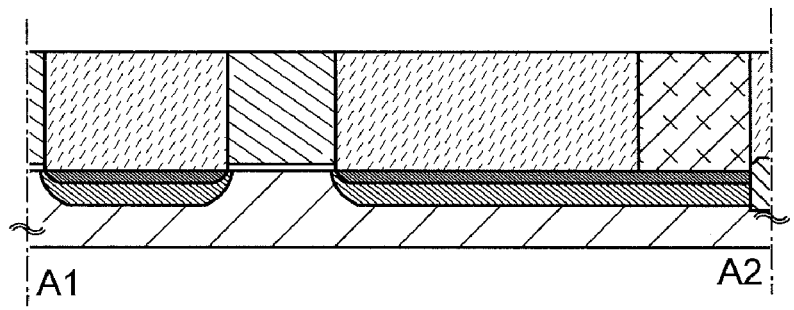

After that, as treatment performed before the transistor 162 and the capacitor 164 are formed, CMP treatment is performed on the insulating layer 128 so that upper surfaces of the gate electrode 110 and the electrode 126 are exposed (see FIG. 11D). As the treatment for exposing the upper surface of the gate electrode 110, etching treatment or the like may be employed as an alternative to CMP treatment. Note that it is preferable to planarize the surface of the insulating layer 128 as much as possible in order to improve the characteristics of the transistor 162. For example, the surface of the insulating layer 128 preferably has a root-mean-square (RMS) roughness of 1 nm or less.

Note that before or after each of the above steps, a step of forming an electrode, a wiring, a semiconductor layer, an insulating layer, or the like may be further performed. For example, when the wiring has a multilayer wiring structure of a layered structure including insulating layers and conductive layers, a highly integrated semiconductor device can also be realized.

<Method for Manufacturing Transistor in Upper Portion>

Figure 12A:
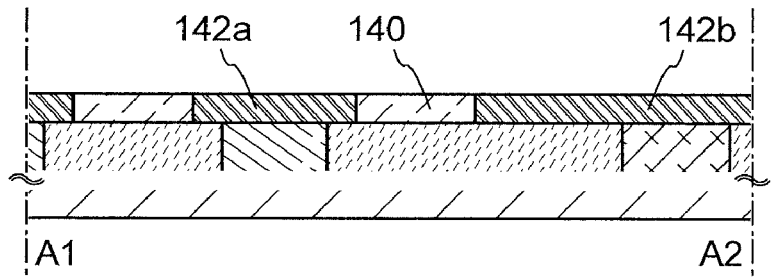
FIGS. 12A to 12D are cross-sectional views of a manufacturing process of a semiconductor device.

Next, a conductive layer is formed over the gate electrode 110, the electrode 126, the insulating layer 128, and the like, and the source electrode 142a and the drain electrode 142b are foamed by selectively etching the conductive layer (see FIG. 12A).

The conductive layer can be formed by a PVD method such as a sputtering method, or a CVD method such as a plasma-enhanced CVD method. As a material of the conductive layer, an element selected from aluminum, chromium, copper, tantalum, titanium, molybdenum, and tungsten, an alloy including any of these elements as a component, or the like can be used. A material including one of manganese, magnesium, zirconium, beryllium, neodymium, and scandium or a combination of a plurality of these elements may be used.

The conductive layer may have a single-layer structure or a layered structure including two or more layers. For example, the conductive layer may have a single-layer structure of a titanium film or a titanium nitride film, a single-layer structure of an aluminum film including silicon, a two-layer structure in which a titanium film is stacked over an aluminum film, a two-layer structure in which a titanium film is stacked over a titanium nitride film, a three-layer structure in which a titanium film, an aluminum film, and a titanium film are stacked in that order, or the like. Note that the conductive layer having a single-layer structure of a titanium film or a titanium nitride film has an advantage in that it can be easily processed into the source electrode 142a and the drain electrode 142b having a tapered shape.

The conductive layer may be formed using a conductive metal oxide. As the conductive metal oxide, indium oxide ($In_2O_3$), tin oxide ($SnO_2$), zinc oxide (ZnO), an indium oxide-tin oxide alloy ($In_2O_3$—$SnO_2$, which is abbreviated to ITO in some cases), an indium oxide-zinc oxide alloy ($In_2O_3$—ZnO), or any of these metal oxide materials including silicon or silicon oxide can be used.

Although either dry etching or wet etching may be performed as the etching of the conductive layer, dry etching which has high controllability is preferably used for miniaturization. The etching may be performed so that the source electrode 142a and the drain electrode 142b to be formed have a tapered shape. The taper angle can be in the range of, 30° to 60°, for example.

The channel length (L) of the transistor 162 in the upper portion is determined by a distance between upper edge portions of the source electrode 142a and the drain electrode 142b. Note that for light exposure for forming a mask in the case of manufacturing a transistor with a channel length (L) of less than 25 nm, light exposure is preferably performed with extreme ultraviolet light whose wavelength is several nanometers to several tens of nanometers, which is extremely short. The resolution of light exposure with extreme ultraviolet light is high and the depth of focus is large. For these reasons, the channel length (L) of the transistor to be formed later can be set to less than 2 μm, preferably in the range of 10 nm to 350 nm (0.35 μm), in which case the circuit can operate at higher speed. Moreover, miniaturization can lead to low power consumption of a semiconductor device.

Note that an insulating layer functioning as a base may be provided over the insulating layer 128. The insulating layer can be formed by a PVD method, a CVD method, or the like.

Next, the insulating layer 140 is formed so as to cover the source electrode 142a and the drain electrode 142b. Then, the insulating layer 140 is planarized by chemical mechanical polishing (CMP) treatment so as to expose the source electrode 142a and the drain electrode 142b (see FIG. 12A).

The insulating layer 140 can be formed using an inorganic insulating material such as silicon oxide, silicon oxynitride, silicon nitride, or aluminum oxide. It is particularly preferable that the insulating layer 140 be formed using, in particular, silicon oxide because the oxide semiconductor layer 144 formed later is in contact with the insulating layer 140. Although there is no particular limitation on the forming method of the insulating layer 140, in consideration of contact with to the oxide semiconductor layer 144, a method in which hydrogen is sufficiently reduced is preferably employed. Examples of such a method include a sputtering method and the like. Needless to say, another film formation method such as a plasma-enhanced CVD method may be used.

The chemical mechanical polishing (CMP) treatment is performed so as to expose at least part of surfaces of the source electrode 142a and the drain electrode 142b. In addition, the CMP treatment is preferably performed under such conditions that the root-mean-square (RMS) roughness of a surface of the insulating layer 140 becomes 1 nm or less (preferably 0.5 nm or less). By the CMP treatment performed under such conditions, the planarity of a surface where the oxide semiconductor layer 144 is foamed later can be improved, and the characteristics of the transistor 162 can be improved.

Note that the CMP treatment may be performed only once or plural times. When the CMP treatment is performed plural times, it is preferable that first polishing be performed at a high polishing rate and final polishing be performed at a low polishing rate. By performing polishing at different polishing rates, the planarity of the surface of the insulating layer 140 can be further improved.

Next, the oxide semiconductor layer 144 is formed by forming an oxide semiconductor layer so as to be in contact with the upper surfaces of the source electrode 142a, the drain electrode 142b, and the insulating layer 140 and then by selectively etching the oxide semiconductor layer.

As the oxide semiconductor layer 144, an In—Sn—Ga—Zn—O-based oxide semiconductor layer which is a four-component metal oxide; an In—Ga—Zn—O-based oxide semiconductor layer, an In—Sn—Zn—O-based oxide semiconductor layer, an In—Al—Zn—O-based oxide semiconductor layer, a Sn—Ga—Zn—O-based oxide semiconductor layer, an Al—Ga—Zn—O-based oxide semiconductor layer, or a Sn—Al—Zn—O-based oxide semiconductor layer which are three-component metal oxides; an In—Zn—O-based oxide semiconductor layer, a Sn—Zn—O-based oxide semiconductor layer, an Al—Zn—O-based oxide semiconductor layer, a Zn—Mg—O-based oxide semiconductor layer, a Sn—Mg—O-based oxide semiconductor layer, or an In—Mg—O-based oxide semiconductor layer which are two-component metal oxides; or an In—O-based oxide semiconductor layer, a Sn—O-based oxide semiconductor layer or a Zn—O-based oxide semiconductor layer can be used. Further, $SiO_2$ may be contained in the above oxide semiconductor.

In particular, an In—Ga—Zn—O-based oxide semiconductor material has sufficiently high resistance when there is no electric field and thus off-state current can be sufficiently reduced. In addition, with high field-effect mobility, the In—Ga—Zn—O-based oxide semiconductor material is suitable for a semiconductor device.

As a typical example of the In—Ga—Zn—O-based oxide semiconductor material, an oxide semiconductor material represented by $InGaO_3(ZnO)_m(m>0)$ is given. Using M instead of Ga, there is an oxide semiconductor material represented by $InMO_3(ZnO)_m$ $(m>0)$. Here, M denotes one or more metal elements selected from gallium (Ga), aluminum (Al), iron (Fe), nickel (Ni), manganese (Mn), cobalt (Co), or the like. For example, M may be Ga, Ga and Al, Ga and Fe, Ga and Ni, Ga and Mn, Ga and Co, or the like. Note that the above-described compositions are derived from the crystal structures that the oxide semiconductor material can have and are mere examples.

An oxide semiconductor material to be used preferably contains at least indium (In) or zinc (Zn). In particular, In and Zn are preferably contained. As a stabilizer for reducing variation in electrical characteristics of a transistor including the oxide semiconductor material, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, an In—Al—Ga—

Zn-based oxide, an In—Sn—Al—Zn-based oxide, an In—Sn—Hf—Zn-based oxide, or an In—Hf—Al—Zn-based oxide can be used.

Note that, for example, an In—Ga—Zn-based oxide means an oxide containing In, Ga, and Zn, and there is no limitation on the ratio of In, Ga, and Zn. The In—Ga—Zn-based oxide may contain a metal element other than the In, Ga, and Zn.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio close to the above atomic ratios can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio close to the above atomic ratios may be used.

However, without limitation to the materials given above, a material with an appropriate composition may be used depending on needed semiconductor characteristics (e.g., mobility, a threshold voltage, and variation). In order to obtain the needed semiconductor characteristics, it is preferable that the carrier density, the impurity concentration, the defect density, the atomic ratio between a metal element and oxygen, the interatomic distance, the density, and the like be set to appropriate values.

As an oxide target used for forming the oxide semiconductor layer 144 by a sputtering method, a target having a composition ratio of In:Ga:Zn=1:x:y (x is greater than or equal to 0 and y is greater than or equal to 0.5 and less than or equal to 5) is preferably used. For example, a target having a composition ratio of In:Ga:Zn=1:1:1 [atomic ratio] (x=1, y=0.5) (that is, $In_2O_3:Ga_2O_3:ZnO=1:1:2$ [molar ratio]) or the like can be used. Furthermore, a target having a composition ratio of In:Ga:Zn=1:1:0.5 [atomic ratio] (x=1, y=0.5), a target having a composition ratio of In:Ga:Zn=1:1:2 [atomic ratio] (x=1, y=2), or a target having a composition ratio of In:Ga:Zn=1:0:1 [atomic ratio] (x=0, y=1) can also be used.

In this embodiment, an oxide semiconductor layer having an amorphous structure is formed as the oxide semiconductor layer 144 by a sputtering method with the use of an In—Ga—Zn—O-based metal oxide target. The thickness ranges from 1 nm to 50 nm, preferably from 2 nm to 20 nm, more preferably from 3 nm to 15 nm.

The relative density of the metal oxide in the metal oxide target is 80% or more, preferably 95% or more, and more preferably 99.9% or more. The use of the metal oxide target with high relative density makes it possible to form an oxide semiconductor layer having a dense structure.

The atmosphere in which the oxide semiconductor layer 144 is formed is preferably a rare gas (typically, argon) atmosphere, an oxygen atmosphere, or a mixed atmosphere containing a rare gas (typically, argon) and oxygen. Specifically, it is preferable to use a high-purity gas atmosphere, for example, from which an impurity such as hydrogen, water, a hydroxyl group, or hydride is removed to a concentration of 1 ppm or less (preferably, 10 ppb or less).

In forming the oxide semiconductor layer 144, for example, an object to be processed is held in a treatment chamber that is maintained under reduced pressure, and the object to be processed is heated to a temperature higher than or equal to 100° C. and lower than 550° C., preferably higher than or equal to 200° C. and lower than or equal to 400° C. Alternatively, the temperature of an object to be processed in forming the oxide semiconductor layer 144 may be room temperature (25° C.±10° C.). Then, moisture in the treatment chamber is removed, a sputtering gas from which hydrogen, water, or the like is removed is introduced, and the above-described target is used; thus, the oxide semiconductor layer 144 is formed. By forming the oxide semiconductor layer 144 while heating the object to be processed, an impurity in the oxide semiconductor layer 144 can be reduced. Moreover, damage due to sputtering can be reduced. In order to remove the moisture from the treatment chamber, it is preferable to use an entrapment vacuum pump. For example, a cryopump, an ion pump, a titanium sublimation pump, or the like can be used. A turbomolecular pump provided with a cold trap may be used. Since hydrogen, water, or the like can be removed from the treatment chamber evacuated with a cryopump or the like, the concentration of an impurity in the oxide semiconductor layer can be reduced.

In addition, it is necessary for the oxide semiconductor layer 144 to reduce the concentration of impurities such as alkali metal and alkaline earth metal as well as the above-described reduction in concentration of impurities such as hydrogen and water.

Alkali metal is not an element included in an oxide semiconductor, and therefore, is an impurity. Also, alkaline earth metal is an impurity in the case where alkaline earth metal is not included in an oxide semiconductor. Alkali metal, in particular, Na becomes $Na^+$ when an insulating film in contact with the oxide semiconductor film is an oxide and Na diffuses into the insulating layer. In addition, in the oxide semiconductor film, Na cuts or enters a bond between metal and oxygen which are included in an oxide semiconductor. As a result, for example, deterioration of characteristics of the transistor, such as a normally-on state of the transistor due to shift of a threshold voltage in the negative direction, or reduction in mobility, occurs. In addition, variation in characteristics also occurs. Such deterioration of characteristics of the transistor and variation in characteristics due to the impurity remarkably appear when the hydrogen concentration in the oxide semiconductor film is very low. Therefore, when the hydrogen concentration in the oxide semiconductor film is less than or equal to $5 \times 10^{19}$ $cm^{-3}$, preferably less than or equal to $5 \times 10^{18}$ $cm^3$, the concentration of the above impurity is preferably reduced. Specifically, a measurement value of a Na concentration by secondary ion mass spectrometry is preferably less than or equal to $5 \times 10^{16}/cm^3$, more preferably less than or equal to $1 \times 10^{16}/cm^3$, still more preferably less than or equal to $1 \times 10^{15}/cm^3$. In a similar manner, a measurement value of a Li concentration is preferably less than or equal to $5 \times 10^{15}/cm^3$, more preferably less than or equal to $1 \times 10^{15}/cm^3$. In a similar manner, a measurement value of a K concentration is preferably less than or equal to $5 \times 10^{15}/cm^3$, more preferably less than or equal to $1 \times 10^{15}/cm^3$.

Figure 12B:
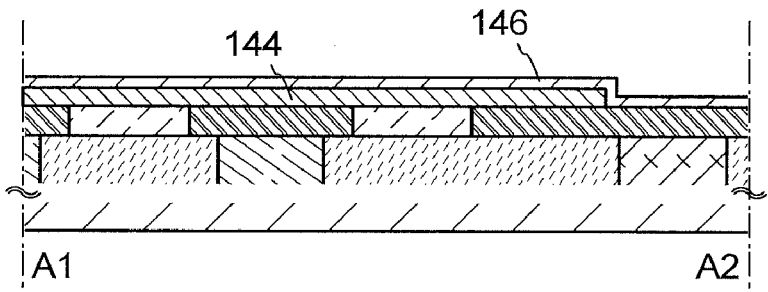

Next, conditions for forming the oxide semiconductor layer 144 can be set as follows: the distance between the object to be processed and the target is 170 mm; the pressure is 0.4 Pa; the direct current (DC) power is 0.5 kW; and the atmosphere is an oxygen (100% oxygen) atmosphere, an argon (100% argon) atmosphere, or a mixed atmosphere of oxygen and argon. Note that a pulsed direct current (DC) power source is preferably used because dust (such as powder substances generated in film formation) can be reduced and the film thickness can be made uniform. The thickness of the oxide semiconductor layer 144 is set in the range of 1 nm to 50 nm, preferably 2 nm to 20 nm, more preferably 3 nm to 15 nm, as described above. By employing a structure according to the invention disclosed herein, a short-channel effect due to miniaturization can be suppressed even in the case of using the oxide semiconductor layer 144 having such a thickness. Note that the appropriate thickness of the oxide semiconductor layer differs depending on the oxide semiconductor material to be used, the intended use of the semiconductor device, or the like; therefore, the thickness can be determined as appropriate in accordance with the material, the intended use, or the like. Note that when the insulating layer 140 is formed in the above manner, a surface over which a portion corresponding to the channel formation region in the oxide semiconductor layer 144 is to be formed can be sufficiently planarized; thus, an oxide semiconductor layer having a small thickness can also be suitably foamed. As illustrated in FIG. 12B, the portion corresponding to the channel formation region in the oxide semiconductor layer 144 preferably has a planar cross-sectional shape. By making the cross-sectional shape of the portion corresponding to the channel formation region in the oxide semiconductor layer 144 flat, leakage current can be reduced as compared to the case where the cross-sectional shape of the oxide semiconductor layer 144 is not flat.

Note that before the oxide semiconductor layer 144 is formed by a sputtering method, reverse sputtering in which plasma is generated with an argon gas introduced may be performed so that a material attached to a formation surface (e.g., a surface of the insulating layer 140) is removed. Here, the reverse sputtering is a method in which ions collide with a surface to be processed so that the surface is modified, in contrast to normal sputtering in which ions collide with a sputtering target. An example of a method for making ions collide with a surface to be processed is a method in which high-frequency voltage is applied to the surface side in an argon atmosphere so that plasma is generated near the object to be processed. Note that an atmosphere of nitrogen, helium, oxygen, or the like may be used instead of an argon atmosphere.

After formation of the oxide semiconductor layer 144, heat treatment (first heat treatment) is preferably performed on the oxide semiconductor layer 144. Through the first heat treatment, excess hydrogen (including water and a hydroxyl group) in the oxide semiconductor layer 144 can be removed, the structure of the oxide semiconductor layer 144 can be ordered, and defect states in an energy gap can be reduced. For example, the temperature of the first heat treatment can be set higher than or equal to 300° C. and lower than 550° C., preferably higher than or equal to 400° C. and lower than or equal to 500° C.

For example, after an object to be processed is introduced into an electric furnace including a resistance heater or the like, the heat treatment can be performed at 450° C. in a nitrogen atmosphere for one hour. The oxide semiconductor layer is not exposed to the air during the heat treatment so that entry of water or hydrogen can be prevented.

The heat treatment apparatus is not limited to the electric furnace and may be an apparatus for heating an object to be processed by thermal radiation or thermal conduction from a medium such as a heated gas. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp A GRTA apparatus is an apparatus for performing heat treatment using a high-temperature gas. As the gas, an inert gas that does not react with an object to be processed by heat treatment, for example, nitrogen or a rare gas such as argon is used.

For example, as the first heat treatment, GRTA treatment may be performed as follows. The object to be processed is put in a heated inert gas atmosphere, heated for several minutes, and taken out of the inert gas atmosphere. The GRTA treatment enables high-temperature heat treatment in a short time. Moreover, the GRTA treatment can be employed even when the temperature exceeds the upper temperature limit of the object to be processed. Note that the inert gas may be switched to a gas including oxygen during the treatment. This is because defect states in an energy gap caused by oxygen deficiency can be reduced by performing the first heat treatment in an atmosphere including oxygen.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into a heat treatment apparatus is set to 6N (99.9999%) or more, preferably 7N (99.99999%) or more (i.e., the impurity concentration is 1 ppm or less, preferably 0.1 ppm or less).

In any case, a transistor with extremely excellent characteristics can be obtained with the use of the oxide semiconductor layer which is an i-type (intrinsic) or substantially i-type oxide semiconductor layer obtained by reducing an impurity, supplying oxygen, and filling oxygen deficiency through the first heat treatment.

The above heat treatment (the first heat treatment) can also be referred to as dehydration treatment, dehydrogenation treatment, or the like because it has the effect of removing hydrogen, water, or the like. The dehydration treatment or the dehydrogenation treatment can be performed after the oxide semiconductor layer 144 is formed, after the gate insulating layer 146 is formed, or after a gate electrode is formed. Such dehydration treatment or dehydrogenation treatment may be conducted once or plural times.

The etching of the oxide semiconductor layer 144 may be performed either before the heat treatment or after the heat treatment. Dry etching is preferably used in terms of element miniaturization, but wet etching may be used. An etching gas or an etchant can be selected as appropriate depending on a material to be etched. Note that in the case where leakage in an element or the like does not cause a problem, the oxide semiconductor layer does not necessarily need to be processed in an island shape.

An oxide conductive layer serving as source and drain regions may be provided between the oxide semiconductor layer 144 and the source and drain electrodes 142a and 142b, as a buffer layer.

As the formation method of the oxide conductive layer, a sputtering method, a vacuum evaporation method (an electron beam evaporation method or the like), an arc discharge ion plating method, or a spray method can be used. As examples of a material which can be used for the oxide conductive layer, there are a zinc oxide, a zinc aluminum oxide, a zinc aluminum oxynitride, a zinc gallium oxide, and the like. The thickness of the oxide conductive layer is set as appropriate in the range from 50 nm to 300 nm. In addition, the above materials may contain silicon oxide.

The shape of the oxide conductive layer can be processed by the same photolithography process as the source electrode 142a and the drain electrode 142b. In addition, the shape of the oxide conductive layer may be processed by the same mask in a photolithography process for forming the oxide semiconductor layer 144.

When the oxide conductive layer is provided as the source region and the drain region between the oxide semiconductor layer 144 and the source and drain electrodes 142a and 142b, the source region and the drain region can have lower resistance and the transistor 162 can operate at high speed.

Including the oxide semiconductor layer 144, the oxide conductive layer, and the drain electrode 142b, the transistor 162 can have a higher withstand voltage.

It is effective to use the oxide conductive layer for a source region and a drain region in order to improve frequency characteristics of a peripheral circuit (a driver circuit). This is because contact resistance can be reduced more in the case where a metal electrode (formed using molybdenum, tungsten, or the like) is in contact with the oxide conductive layer than in the case where a metal electrode (formed using molybdenum, tungsten, or the like) is in contact with the oxide semiconductor layer. The contact resistance can be reduced by interposing the oxide conductive layer between the oxide semiconductor layer and the source and drain electrode layers; accordingly, frequency characteristics of a peripheral circuit (a driver circuit) can be improved.

Next, the gate insulating layer 146 is formed so as to cover the oxide semiconductor layer 144 (see FIG. 12B).

The gate insulating layer 146 can be formed by a CVD method, a sputtering method, or the like. The gate insulating layer 146 is preferably formed so as to contain silicon oxide, silicon nitride, silicon oxynitride, aluminum oxide, tantalum oxide, hafnium oxide, yttrium oxide, hafnium silicate (HfSi$_x$O$_y$ (x>0, y>0)), hafnium silicate to which nitrogen is added (HfSi$_x$O$_y$ (x>0, y>0)), hafnium aluminate to which nitrogen is added (HfAl$_x$O$_y$ (x>0, y>0)), or the like. The gate insulating layer 146 may have a single-layer structure or a layered structure. There is no particular limitation on the thickness of the gate insulating layer 146; the thickness is preferably small in order to ensure the operation of the transistor when the semiconductor device is miniaturized. For example, in the case of using silicon oxide, the thickness can be in the range of 1 nm to 100 nm, preferably 10 nm to 50 nm.

When the gate insulating layer is thin as described above, gate leakage due to a tunneling effect or the like becomes a problem. In order to solve the problem of gate leakage, the gate insulating layer 146 may be formed using a high dielectric constant (high-k) material such as hafnium oxide, tantalum oxide, yttrium oxide, hafnium silicate (HfSi$_x$O$_y$ (x>0, y>0)), hafnium silicate to which nitrogen is added (HfSi$_x$O$_y$ (x>0, y>0), or hafnium aluminate to which nitrogen is added (HfAl$_x$O$_y$ (x>0, y>0)). The use of a high-k material for the gate insulating layer 146 makes it possible to increase the thickness in order to suppress gate leakage as well as ensuring electrical properties. For example, the relative permittivity of hafnium oxide is approximately 15, which is much higher than that of silicon oxide which is 3 to 4. With such a material, a gate insulating layer where the equivalent oxide thickness is less than 15 nm, preferably greater than or equal to 2 nm and less than or equal to 10 nm, can be easily formed. Note that a layered structure of a film including a high-k material and a film including any of silicon oxide, silicon nitride, silicon oxynitride, silicon nitride oxide, aluminum oxide, and the like may also be employed.

As the gate insulating layer 146, an oxide film, a nitride film, or a metal oxide film is preferably used as a film in contact with the oxide semiconductor layer 144; for example, a material such as silicon oxide, silicon nitride, silicon oxynitride, or silicon nitride oxide is used. Alternatively, a material including a Group 13 element and oxygen can be used. For example, as the material including a Group 13 element and oxygen, a material including one or more of gallium oxide, aluminum oxide, aluminum gallium oxide, and gallium aluminum oxide is given. Here, aluminum gallium oxide refers to a material in which the amount of aluminum is larger than that of gallium in atomic percent, and gallium aluminum oxide refers to a material in which the amount of gallium is larger than or equal to that of aluminum in atomic percent.

The metal oxide film can be formed with a single-layer structure or a layered structure using the above-described materials.

After the gate insulating layer 146 is formed, second heat treatment is preferably performed in an inert gas atmosphere or an oxygen atmosphere. The temperature of the heat treatment is set in the range of 200° C. to 450° C., preferably 250° C. to 350° C. For example, the heat treatment may be performed at 250° C. in a nitrogen atmosphere for one hour. By the second heat treatment, variation in electrical characteristics of the transistor can be reduced. In the case where the gate insulating layer 146 contains oxygen, oxygen can be supplied to the oxide semiconductor layer 144 and oxygen deficiency in the oxide semiconductor layer 144 can be filled; thus, the oxide semiconductor layer which is i-type (intrinsic) or substantially i-type can also be formed.

Note that the second heat treatment is performed in this embodiment after the gate insulating layer 146 is formed; the timing of the second heat treatment is not limited to this. For example, the second heat treatment may be performed after the gate electrode is formed. Alternatively, the first heat treatment and the second heat treatment may be performed in succession, or the first heat treatment may double as the second heat treatment, or the second heat treatment may double as the first heat treatment.

By performing at least one of the first heat treatment and the second heat treatment as described above, the oxide semiconductor layer 144 can be purified so as to contain impurities other than main components as little as possible.

Next, the gate electrode 148 is formed over the gate insulating layer 146.

The gate electrode 148 can be formed by forming a conductive layer over the gate insulating layer 146 and then by selectively etching the conductive layer. The conductive layer to be the gate electrode 148 can be formed by a PVD method such as a sputtering method, or a CVD method such as a plasma-enhanced CVD method. The details are similar to those in the case of the source electrode 142a, the drain electrode 142b, or the like; thus, the description thereof can be referred to.

Figure 12C:
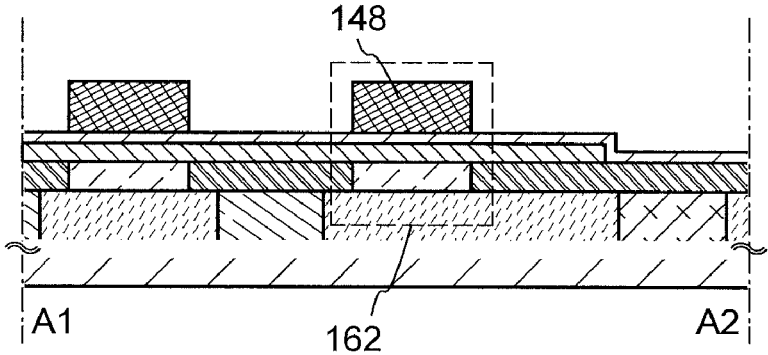

Through the above steps, the transistor 162 including the oxide semiconductor layer 144, which is purified, is completed (see FIG. 12C). The transistor 162 as described above has the feature of sufficiently small off-state current. Therefore, with the use of the transistor as a writing transistor, charge can be held for a long time.

Figure 12D:
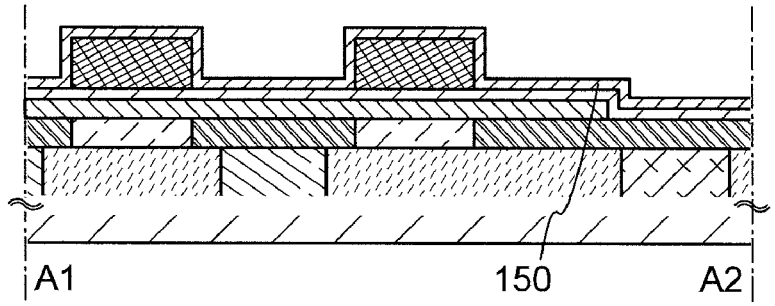

Then, the insulating layer 150 is fanned over the gate insulating layer 146 and the gate electrode 148 (see FIG. 12D). The insulating layer 150 can be formed by a PVD method, a CVD method, or the like. The insulating layer 150 can be formed so as to have a single-layer structure or a layered structure using a material including an inorganic insulating material such as silicon oxide, silicon oxynitride, silicon nitride, hafnium oxide, or aluminum oxide.

Note that the insulating layer 150 is preferably formed using a low dielectric constant material or a low dielectric constant structure (such as a porous structure). This is because when the insulating layer 150 has a low dielectric constant, capacitance generated between wirings, electrodes, or the like can be reduced and operation at higher speed can be achieved.

Figure 13A:
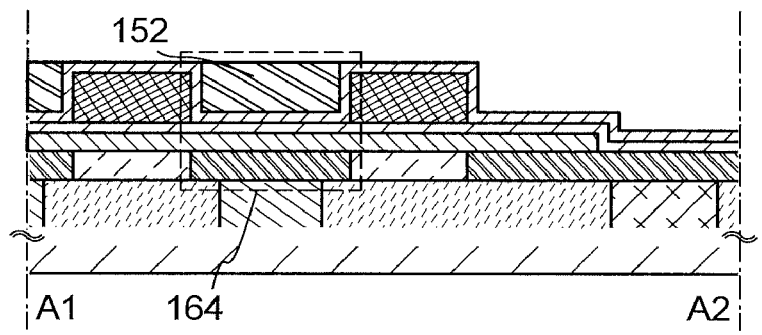
FIGS. 13A to 13C are cross-sectional views of a manufacturing process of a semiconductor device.
Figure 13B:
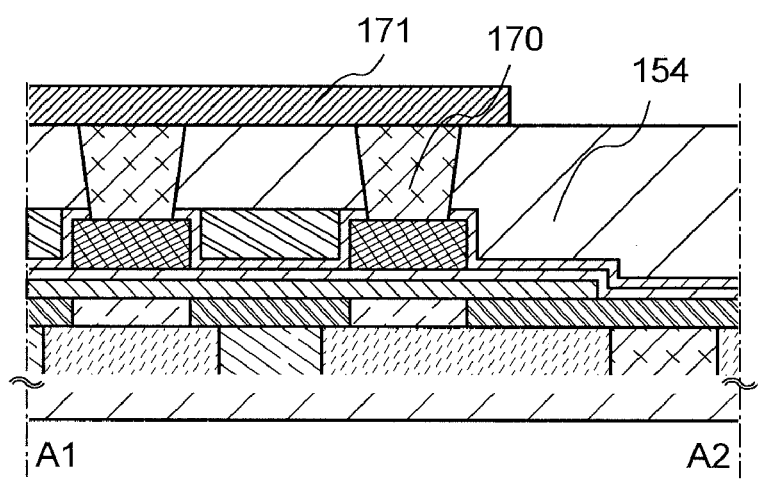
Figure 13C:
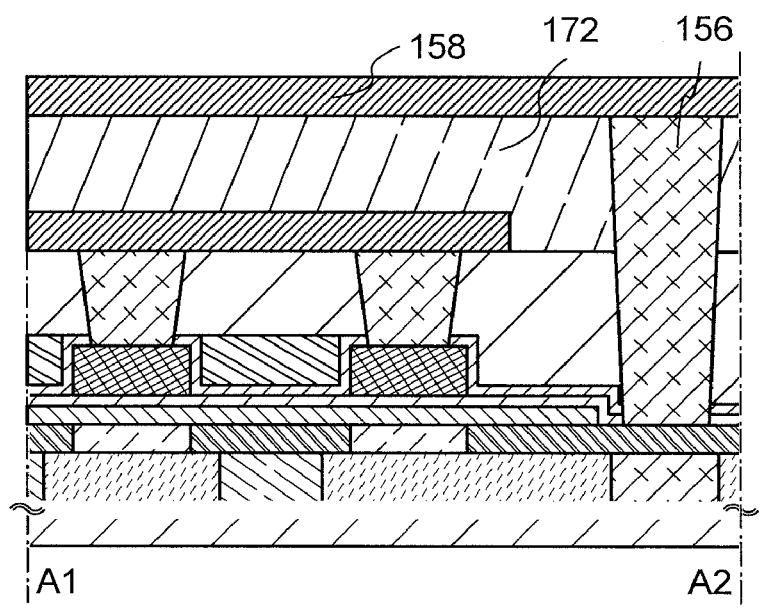

Next, the electrode 152 is formed over the insulating layer 150 so as to overlap with the source electrode 142a (see FIG. 13A). The method and materials for forming the gate electrode 148 can be applied to the electrode 152; therefore, the description of the gate electrode 148 can be referred to for the details of the electrode 152. Through the above steps, the capacitor 164 is completed.

Next, the insulating layer 154 is formed over the insulating layer 150 and the electrode 152. An opening reaching the gate electrode 148 is formed in the insulating layer 150 and the insulating layer 154; then, the electrode 170 is formed in the opening. The wiring 171 in contact with the electrode 170 is formed over the insulating layer 154 (see FIG. 13B). The opening is formed by selective etching with the use of a mask or the like.

Next, the insulating layer 172 is formed over the insulating layer 154 and the wiring 171. Next, an opening reaching the drain electrode 142b is formed in the gate insulating layer 146, the insulating layer 150, the insulating layer 154, and the insulating layer 172; then, the electrode 156 is formed in the opening. The wiring 158 in contact with the electrode 156 is formed over the insulating layer 172 (see FIG. 13C). The opening is formed by selective etching with the use of a mask or the like.

Like the insulating layer 150, the insulating layer 154 and the insulating layer 172 can be formed by a PVD method, a CVD method, or the like. The insulating layer 154 and the insulating layer 172 can be formed so as to have a single-layer structure or a layered structure using a material including an inorganic insulating material such as silicon oxide, silicon oxynitride, silicon nitride, hafnium oxide, or aluminum oxide.

Note that the insulating layer 154 and the insulating layer 172 are preferably formed using a low dielectric constant material or a low dielectric constant structure (such as a porous structure). This is because when the insulating layer 154 and the insulating layer 172 each have a low dielectric constant, capacitance generated between wirings, electrodes, or the like can be reduced and operation at higher speed can be achieved.

Note that the insulating layer 154 and the insulating layer 172 are desirably formed so as to have a flat surface. This is because when the insulating layer 154 and the insulating layer 172 each have a flat surface, an electrode, a wiring, or the like can be favorably framed over the insulating layer 154 and the insulating layer 172 even in the case where the semiconductor device or the like is miniaturized. Note that the insulating layer 154 and the insulating layer 172 can be planarized using a method such as chemical mechanical polishing (CMP).

The electrode 170 and the electrode 156 can be formed in such a manner, for example, that a conductive layer is formed in regions including the openings by a PVD method, a CVD method, or the like and then part of the conductive layer is removed by etching, CMP, or the like.

Specifically, it is possible to employ a method, for example, in which a thin titanium film is formed in regions including the openings by a PVD method and a thin titanium nitride film is formed by a CVD method, and then, a tungsten film is formed so as to be embedded in the openings. Here, the titanium film formed by a PVD method functions to reduce an oxide film (e.g., a native oxide film) formed on a surface where the titanium film is formed, and to decrease the contact resistance with a lower electrode or the like (here, the drain electrode 142b). The titanium nitride film formed after the formation of the titanium film has a barrier function for suppressing diffusion of the conductive material. A copper film may be formed by a plating method after the formation of a barrier film of titanium, titanium nitride, or the like.

The wiring 171 and the wiring 158 are formed by forming a conductive layer by a PVD method such as a sputtering method, or a CVD method such as a plasma-enhanced CVD method, and then by etching the conductive layer into a desired shape. As a material of the conductive layer, an element selected from aluminum, chromium, copper, tantalum, titanium, molybdenum, and tungsten, an alloy including any of these elements as a component, or the like can be used. A material including one of manganese, magnesium, zirconium, beryllium, neodymium, and scandium or a combination of a plurality of these elements may be used. The details are similar to those of the source electrode 142a and the like.

Note that a variety of wirings, electrodes, or the like may be formed after the above steps. The wirings or the electrodes can be fanned by a method such as a so-called damascene method or dual damascene method.

Through the above steps, the semiconductor device having the structure illustrated in FIGS. 9A and 9B can be manufactured.

In the transistor 162 described in this embodiment, the oxide semiconductor layer 144 is purified and thus contains hydrogen at a concentration of $5 \times 10^{19}$ atoms/cm$^3$ or less, preferably $5 \times 10^{18}$ atoms/cm$^3$ or less, more preferably $5 \times 10^{17}$ atoms/cm$^3$ or less. In addition, the carrier density of the oxide semiconductor layer 144 is, for example, less than $1 \times 10^{12}$/cm$^3$, preferably less than $1.45 \times 10^{10}$/cm$^3$, which is sufficiently lower than the carrier density of a general silicon wafer (approximately $1 \times 10^{14}$/cm$^3$). In addition, the off-state current of the transistor 162 is sufficiently small. For example, the off-state current (per unit channel width (1 μm), here) of the transistor 162 at room temperature (25° C.) is 100 zA (1 zA (zeptoampere) is $1 \times 10^{-21}$ A) or less, preferably 10 zA or less.

In this manner, by using the oxide semiconductor layer 144 which is purified and is intrinsic, it becomes easy to sufficiently reduce the off-state current of the transistor 162. With the use of the transistor 162 as described above, a semiconductor device in which stored data can be held for an extremely long time can be provided.

The configurations, methods, and the like described in this embodiment can be combined as appropriate with any of the configurations, methods, and the like described in the other embodiments.

Embodiment 4

In this embodiment, an example of a transistor that can be applied to a semiconductor device disclosed in this specification will be described. There is no particular limitation on the structure of the transistor that can be applied to a semiconductor device disclosed in this specification; for example, a staggered type or a planar type having a top-gate structure or a bottom-gate structure can be employed. The transistor may have a single-gate structure in which one channel formation region is formed, a double-gate structure in which two channel formation regions are formed, or a triple-gate structure in which three channel formation regions are formed. Alternatively, the transistor may have a dual gate structure including two gate electrode layers positioned over and below a channel region with a gate insulating layer provided therebetween.

FIGS. 14A to 14D each illustrate an example of a cross-sectional structure of a transistor that can be applied to a semiconductor device disclosed in this specification (for example, the transistor 212 in Embodiment 1). In each of FIGS. 14A to 14D, the transistor is provided over an insulating layer 400; however, the transistor may be provided over a substrate such as a glass substrate.

Figure 14A:
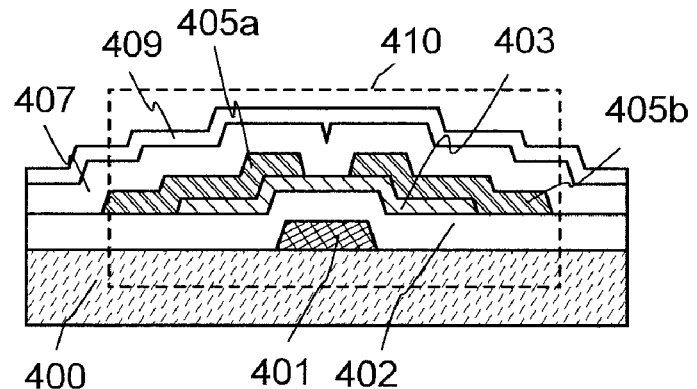
FIGS. 14A to 14D are cross-sectional views of semiconductor devices.

A transistor 410 illustrated in FIG. 14A is one of bottom-gate thin film transistors and is also referred to as an inverted staggered thin film transistor.

The transistor 410 includes, over the insulating layer 400, a gate electrode layer 401, a gate insulating layer 402, an oxide semiconductor layer 403, a source electrode layer 405a, and a drain electrode layer 405b. Further, an insulating layer 407 stacked over the oxide semiconductor layer 403 is provided so as to cover the transistor 410. An insulating layer 409 is provided over the insulating layer 407.

Figure 14B:
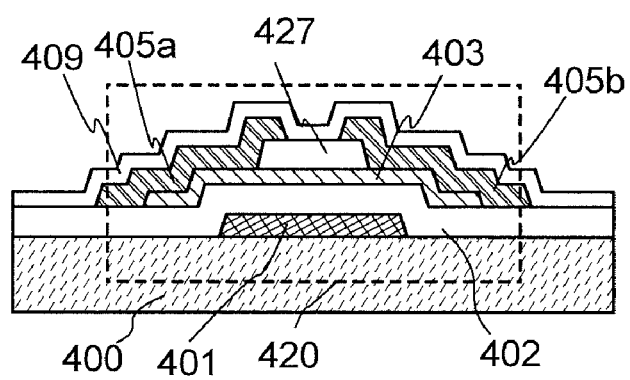

A transistor 420 illustrated in FIG. 14B is one of bottom-gate transistors referred to as a channel-protective type (also referred to as a channel-stop type) and is also referred to as an inverted staggered thin film transistor.

The transistor 420 includes, over the insulating layer 400, the gate electrode layer 401, the gate insulating layer 402, the oxide semiconductor layer 403, an insulating layer 427 functioning as a channel protective layer which covers a channel formation region of the oxide semiconductor layer 403, the source electrode layer 405a, and the drain electrode layer 405b. The insulating layer 409 is formed to cover the transistor 420.

Figure 14C:
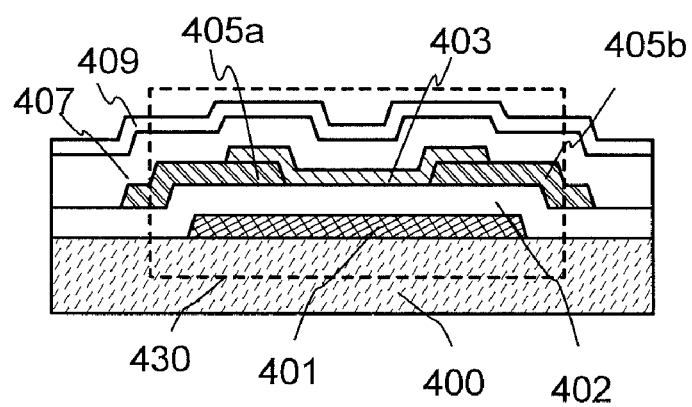

A transistor 430 illustrated in FIG. 14C is a bottom-gate thin film transistor and includes, over the insulating layer 400 that is the substrate having an insulating surface, the gate electrode layer 401, the gate insulating layer 402, the source electrode layer 405a, the drain electrode layer 405b, and the oxide semiconductor layer 403. Further, the insulating layer 407 being in contact with the oxide semiconductor layer 403 is provided so as to cover the transistor 430. The insulating layer 409 is provided over the insulating layer 407.

In the transistor 430, the gate insulating layer 402 is provided on and in contact with the insulating layer 400 and the gate electrode layer 401, and the source electrode layer 405a and the drain electrode layer 405b are provided on and in contact with the gate insulating layer 402. Further, the oxide semiconductor layer 403 is provided over the gate insulating layer 402, the source electrode layer 405a, and the drain electrode layer 405b.

Figure 14D:
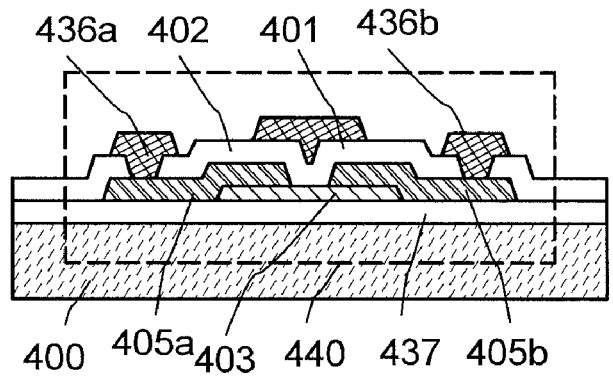

A transistor 440 illustrated in FIG. 14D is one of top-gate thin film transistors. The transistor 440 includes, over the insulating layer 400, an insulating layer 437, the oxide semiconductor layer 403, the source electrode layer 405a, the drain electrode layer 405b, the gate insulating layer 402, and the gate electrode layer 401. A wiring layer 436a and a wiring layer 436b are provided to be in contact with and electrically connected to the source electrode layer 405a and the drain electrode layer 405b, respectively.

In the case of forming each of the bottom-gate transistors 410, 420, and 430 over a substrate, an insulating film serving as a base film may be provided between the insulating layer 400 and the gate electrode layer. The base film has a function of preventing diffusion of an impurity element from the insulating layer 400, and can be formed with a single-layer structure or a layered structure using one or more of a silicon nitride film, a silicon oxide film, a silicon nitride oxide film, and a silicon oxynitride film.

The gate electrode layer 401 can be formed to have a single-layer or layered structure using a metal material such as molybdenum, titanium, chromium, tantalum, tungsten, aluminum, copper, neodymium, or scandium, or an alloy material which contains any of these materials as its main component.

The gate insulating layer 402 can be formed with a single-layer structure or a layered structure using any of a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, and a hafnium oxide layer by a plasma-enhanced CVD method, a sputtering method, or the like. For example, by a plasma-enhanced CVD method, a silicon nitride layer ($SiN_y$ (y>0)) with a thickness of greater than or equal to 50 nm and less than or equal to 200 nm is formed as a first gate insulating layer, and a silicon oxide layer ($SiO_x$ (x>0)) with a thickness of greater than or equal to 5 nm and less than or equal to 300 nm is formed as a second gate insulating layer over the first gate insulating layer, so that a gate insulating layer with a total thickness of 200 nm is formed.

As the conductive film used for the source electrode layer 405a and the drain electrode layer 405b, for example, a film of an element selected from Al, Cr, Cu, Ta, Ti, Mo, and W, a film of an alloy containing any of these elements as a component, an alloy film containing these elements in combination, or the like can be used. The conductive film may have a structure in which a high-melting-point metal layer of Ti, Mo, W, or the like is stacked over and/or below a metal layer of Al, Cu, or the like. When an Al material to which an element (e.g., Si, Nd, or Sc) which prevents generation of hillocks and whiskers in an Al film is added is used, heat resistance can be increased.

A material similar to that for the source electrode layer 405a and the drain electrode layer 405b can be used for a conductive film used for the wiring layer 436a and the wiring layer 436b which are respectively connected to the source electrode layer 405a and the drain electrode layer 405b.

Alternatively, the conductive film to be the source electrode layer 405a and the drain electrode layer 405b (including a wiring layer formed using the same layer as the source and drain electrode layers) may be formed using a conductive metal oxide. As conductive metal oxide, indium oxide ($In_2O_3$), tin oxide ($SnO_2$), zinc oxide (ZnO), an indium oxide-tin oxide alloy ($In_2O_3$—$SnO_2$; abbreviated to ITO), an indium oxide-zinc oxide alloy ($In_2O_3$—ZnO), or any of these metal oxide materials in which silicon oxide is contained can be used.

As the insulating layer 407, the insulating layer 427, and the insulating layer 437, typically, an inorganic insulating film such as a silicon oxide film, a silicon oxynitride film, an aluminum oxide film, or an aluminum oxynitride film can be used.

As the insulating layer 409, an inorganic insulating film such as a silicon nitride film, an aluminum nitride film, a silicon nitride oxide film, or an aluminum nitride oxide film can be used.

In addition, a planarization insulating film may be formed over the insulating layer 409 in order to reduce surface unevenness due to the transistor. As the planarization insulating film, an organic material such as polyimide, an acrylic resin, and a benzocyclobutene-based resin can be used. Other than such organic materials, it is also possible to use a low-dielectric constant material (a low-k material) or the like. Note that the planarization insulating film may be formed by stacking a plurality of insulating films formed from these materials.

Figure 15A:
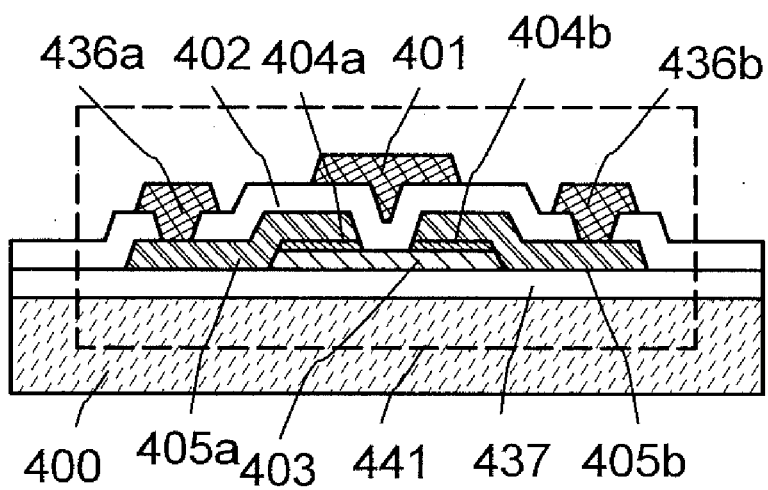
FIGS. 15A and 15B are cross-sectional views of semiconductor devices.

In addition, between the oxide semiconductor layer 403 and the source and drain electrode layers 405a and 405b, an oxide conductive layer functioning as a source region and a drain region may be provided as a buffer layer. FIG. 15A illustrates a transistor 441 in which the transistor 440 of FIG. 14D is provided with an oxide conductive layer, and FIG. 15B illustrates a transistor 442 in which the transistor 440 of FIG. 14D is provided with an oxide conductive layer.

Figure 15B:
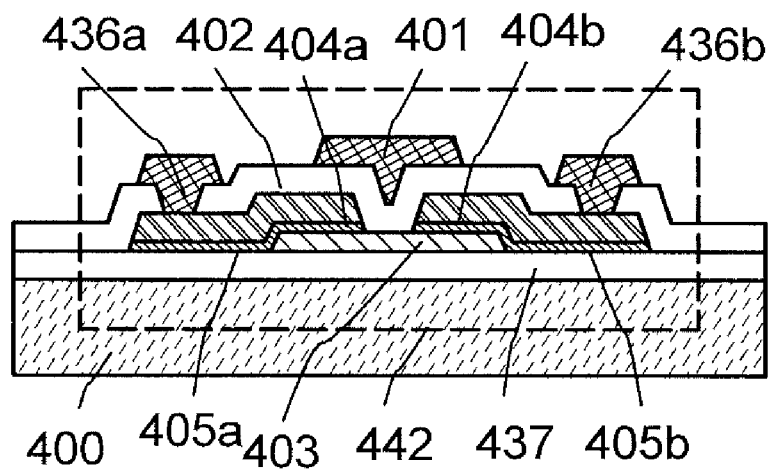

In each of the transistor 441 of FIG. 15A and the transistor 442 of FIG. 15B, an oxide conductive layer 404a and an oxide conductive layer 404b which function as a source region and a drain region are formed between the oxide semiconductor layer 403 and the source electrode layer 405a and between the oxide semiconductor layer 403 and the drain electrode layer 405b, respectively. The transistor 441 of FIG. 15A and the transistor 442 of FIG. 15B are examples in which the shapes of the oxide conductive layer 404a and the oxide conductive layer 404b in FIG. 15A are different from those in FIG. 15B depending on a manufacturing process.

In the transistor 441 of FIG. 15A, an oxide semiconductor film and an oxide conductive film are stacked, and a layered structure of the oxide semiconductor film and the oxide conductive film is processed by the same photolithography process, whereby the island-shaped oxide semiconductor layer 403 and an island-shaped oxide conductive film are formed. After the source electrode layer 405a and the drain electrode layer 405b are formed over the oxide semiconductor layer and the oxide conductive film, the island-shaped oxide conductive film is etched using the source electrode layer 405a and the drain electrode layer 405b as masks, whereby the oxide conductive layer 404a and the oxide conductive layer 404b which serve as a source region and a drain region are formed.

In the transistor 442 of FIG. 15B, an oxide conductive film is formed over the oxide semiconductor layer 403, a metal conductive film is formed thereover, the oxide conductive film and the metal conductive film are processed by the same photolithography process, whereby the oxide conductive layer 404a and the oxide conductive layer 404b, the source electrode layer 405a, and the drain electrode layer 405b are formed.

Note that when etching treatment for processing the shape of the oxide conductive layer is performed, etching conditions (the type of etching materials, the concentration, the etching time, and the like) are adjusted as appropriate so as not to excessively etch the oxide semiconductor layer.

As the formation method of the oxide conductive layer 404a and the oxide conductive layer 404b, a sputtering method, a vacuum evaporation method (an electron beam evaporation method or the like), an arc discharge ion plating method, or a spray method can be used. As examples of a material which can be used for the oxide conductive layer, there are a zinc oxide, a zinc aluminum oxide, a zinc aluminum oxynitride, a zinc gallium oxide and the like. In addition, the above materials may contain silicon oxide.

When the oxide conductive layer is provided between the oxide semiconductor layer 403 and the source and drain electrode layers 405a and 405b as the source region and the drain region, the source region and the drain region can have lower resistance and the transistors 441 and 442 can operate at high speed.

With the structure of the oxide semiconductor layer 403, the oxide conductive layer 404a, the oxide conductive layer 404b, the source electrode layer 405a, and the drain electrode layer 405b, withstand voltage of each of the transistor 441 and the transistor 442 can be further increased.

This embodiment can be implemented in appropriate combination with the structures described in the other embodiments.

Embodiment 5

Figure 16A:
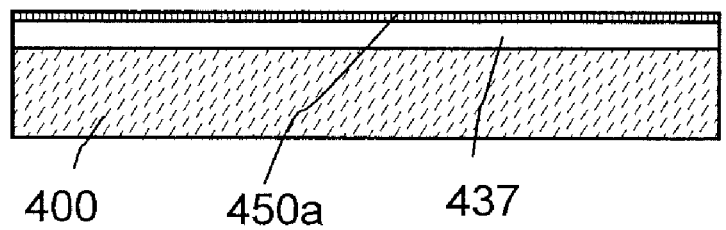
FIGS. 16A to 16C are cross-sectional views of a manufacturing process of a semiconductor device.
Figure 16B:
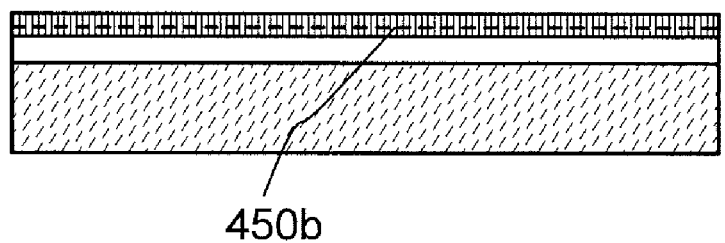

One embodiment of an oxide semiconductor layer which can be used as the semiconductor layers of the transistors in Embodiments 1 to 4 will be described with reference to FIGS. 16A to 16C.

The oxide semiconductor layer of this embodiment has a structure including a first crystalline oxide semiconductor layer and a second crystalline oxide semiconductor layer which is stacked over the first crystalline oxide semiconductor layer and has a larger thickness than the first crystalline oxide semiconductor layer.

The insulating layer 437 is formed over the insulating layer 400. In this embodiment, an oxide insulating layer with a thickness greater than or equal to 50 nm and less than or equal to 600 nm is formed as the insulating layer 437 by a PCVD method or a sputtering method. For example, a single layer selected from a silicon oxide film, a gallium oxide film, an aluminum oxide film, a silicon oxynitride film, an aluminum oxynitride film, and a silicon nitride oxide film or a stack of any of these films can be used.

Next, a first oxide semiconductor film with a thickness greater than or equal to 1 nm and less than or equal to 10 nm is formed over the insulating layer 437. The first oxide semiconductor film is formed by a sputtering method, and the substrate temperature in the film formation by a sputtering method is set to be higher than or equal to 200° C. and lower than or equal to 400° C.

In this embodiment, the first oxide semiconductor film is formed to a thickness of 5 nm in an oxygen atmosphere, an argon atmosphere, or an atmosphere including argon and oxygen under conditions where a metal oxide target (an In—Ga—Zn—O-based metal oxide target including $In_2O_3$, $Ga_2O_3$, and ZnO at 1:1:2 [molar ratio]) is used, the distance between the substrate and the target is 170 mm, the substrate temperature is 250° C., the pressure is 0.4 Pa, and the direct current (DC) power is 0.5 kW.

Next, first heat treatment is performed under a condition where the atmosphere of a chamber in which the substrate is set is an atmosphere of nitrogen or dry air. The temperature of the first heat treatment is higher than or equal to 400° C. and lower than or equal to 750° C. Through the first heat treatment, a first crystalline oxide semiconductor layer 450a is formed (see FIG. 16A).

Depending on the temperature of the first heat treatment, the first heat treatment causes crystallization from a film surface and crystal grows from the film surface toward the inside of the film; thus, C-axis aligned crystal is obtained. By the first heat treatment, a large amount of zinc and oxygen gather to the film surface, and one or more layers of graphene-type two-dimensional crystal including zinc and oxygen and having a hexagonal upper plane are formed at the outermost surface; the layer(s) at the outermost surface grow in the thickness direction to form a stack of layers. By increasing the temperature of the heat treatment, crystal growth proceeds from the surface to the inside and further from the inside to the bottom.

By the first heat treatment, oxygen in the insulating layer 437 that is an oxide insulating layer is diffused to an interface between the insulating layer 437 and the first crystalline oxide semiconductor layer 450a or the vicinity of the interface (within ±5 nm from the interface), whereby oxygen deficiency in the first crystalline oxide semiconductor layer is reduced. Therefore, it is preferable that oxygen be included in (in a bulk of) the insulating layer 437 used as a base insulating layer or at the interface between the first crystalline oxide semiconductor layer 450a and the insulating layer 437 at an amount that exceeds at least the stoichiometric composition ratio.

Next, a second oxide semiconductor film with a thickness more than 10 nm is formed over the first crystalline oxide semiconductor layer 450a. The second oxide semiconductor film is formed by a sputtering method, and the substrate temperature in the film formation is set to be higher than or equal to 200° C. and lower than or equal to 400° C. By setting the substrate temperature in the film formation to be higher than or equal to 200° C. and lower than or equal to 400° C., precursors can be arranged in the oxide semiconductor layer formed over and in contact with the surface of the first crystalline oxide semiconductor layer and so-called orderliness can be obtained.

In this embodiment, the second oxide semiconductor film is formed to a thickness of 25 nm in an oxygen atmosphere, an argon atmosphere, or an atmosphere including argon and oxygen under conditions where a metal oxide target (an In—Ga—Zn—O-based metal oxide target including $In_2O_3$, $Ga_2O_3$, and ZnO at 1:1:2 [molar ratio]) is used, the distance between the substrate and the target is 170 mm, the substrate temperature is 400° C., the pressure is 0.4 Pa, and the direct current (DC) power is 0.5 kW.

Next, second heat treatment is performed under a condition where the atmosphere of a chamber in which the substrate is set is a nitrogen atmosphere, an oxygen atmosphere, or a mixed atmosphere of nitrogen and oxygen. The temperature of the second heat treatment is higher than or equal to 400° C. and lower than or equal to 750° C. Through the second heat treatment, a second crystalline oxide semiconductor layer 450b is formed (see FIG. 16B). The second heat treatment is performed in a nitrogen atmosphere, an oxygen atmosphere, or a mixed atmosphere of nitrogen and oxygen, whereby the density of the second crystalline oxide semiconductor layer 450b is increased and the number of defects therein is reduced. By the second heat treatment, crystal growth proceeds in the thickness direction with the use of the first crystalline oxide semiconductor layer 450a as a nucleus, that is, crystal growth proceeds from the bottom to the inside; thus, the second crystalline oxide semiconductor layer 450b is formed.

It is preferable that steps from the formation of the insulating layer 437 to the second heat treatment be successively performed without exposure to the air. The steps from the formation of the insulating layer 437 to the second heat treatment are preferably performed in an atmosphere which is controlled to include little hydrogen and moisture (such as an inert gas atmosphere, a reduced-pressure atmosphere, or a dry-air atmosphere); in terms of moisture, for example, a dry nitrogen atmosphere with a dew point of −40° C. or lower, preferably a dew point of −50° C. or lower may be employed.

Figure 16C:
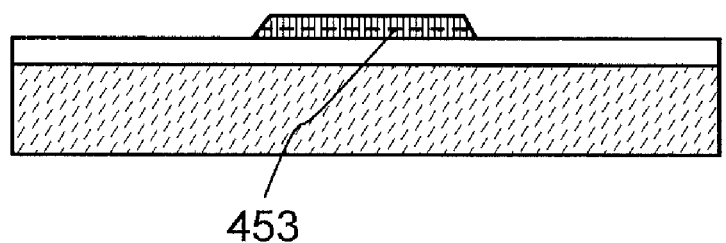

Next, the stack of the oxide semiconductor layers, the first crystalline oxide semiconductor layer 450a and the second crystalline oxide semiconductor layer 450b, is processed into an oxide semiconductor layer 453 including a stack of island-shaped oxide semiconductor layers (see FIG. 16C). In the drawing, the interface between the first crystalline oxide semiconductor layer 450a and the second crystalline oxide semiconductor layer 450b is indicated by a dotted line, and the first crystalline oxide semiconductor layer 450a and the second crystalline oxide semiconductor layer 450b are illustrated as a stack of oxide semiconductor layers; however, the interface is actually not distinct and is illustrated for easy understanding.

The stack of the oxide semiconductor layers can be processed by being etched after a mask having a desired shape is formed over the stack of the oxide semiconductor layers. The mask can be formed by a method such as photolithography. Alternatively, the mask may be formed by a method such as an ink-jet method.

For the etching of the stack of the oxide semiconductor layers, either dry etching or wet etching may be employed. Needless to say, both of them may be employed in combination.

A feature of the first crystalline oxide semiconductor layer 450a and the second crystalline oxide semiconductor layer 450b obtained by the above formation method is that they have C-axis alignment. Note that the first crystalline oxide semiconductor layer 450a and the second crystalline oxide semiconductor layer 450b comprise an oxide including a crystal with C-axis alignment (also referred to as C-axis aligned crystal (CAAC)), which has neither a single crystal structure nor an amorphous structure. The first crystalline oxide semiconductor layer 450a and the second crystalline oxide semiconductor layer 450b partly include a crystal grain boundary.

In order to obtain CAAC, it is important to form hexagonal crystals in an initial stage of deposition of an oxide semiconductor film and to cause crystal growth from the hexagonal crystals as nuclei. In order to achieve this, it is preferable that a substrate heating temperature be 100° C. to 500° C., more preferably 200° C. to 400° C., still preferably 250° C. to 300° C. In addition to this, the deposited oxide semiconductor film is subjected to heat treatment at a temperature higher than the substrate heating temperature in the deposition. Therefore, microdefects in the film and defects at the interface of a stacked layer can be compensated.

Note that the first crystalline oxide semiconductor layer and the second crystalline oxide semiconductor layer are each formed using an oxide material including at least Zn. For example, a four-component metal oxide such as an In—Al—Ga—Zn—O-based material or an In—Sn—Ga—Zn—O-based material; a three-component metal oxide such as an In—Ga—Zn—O-based material, an In—Al—Zn—O-based material, an In—Sn—Zn—O-based material, a Sn—Ga—Zn—O-based material, an Al—Ga—Zn—O-based material, or a Sn—Al—Zn—O-based material; a two-component metal oxide such as an In—Zn—O-based material, a Sn—Zn—O-based material, an Al—Zn—O-based material, or a Zn—Mg—O-based material; a Zn—O-based material; or the like can be used. Further, an In—Si—Ga—Zn—O-based based material, an In—Ga—B—Zn—O-based material, or an In—B—Zn—O-based material may be used. In addition, the above materials may include $SiO_2$. Here, for example, an In—Ga—Zn—O-based material means an oxide film including indium (In), gallium (Ga), and zinc (Zn), and there is no particular limitation on the composition ratio. Further, the In—Ga—Zn—O-based material may include an element other than In, Ga, and Zn.

Without limitation to the two-layer structure in which the second crystalline oxide semiconductor layer is formed over the first crystalline oxide semiconductor layer, a layered structure including three or more layers may be formed by repeatedly performing a process of film formation and heat treatment for forming a third crystalline oxide semiconductor layer after the second crystalline oxide semiconductor layer is formed.

The oxide semiconductor layer 453 including the stack of the oxide semiconductor layers formed by the above formation method can be used as appropriate for a transistor (e.g., the transistor 212 in Embodiment 1, or the transistor 312 in Embodiment 2) which can be applied to a semiconductor device disclosed in this specification.

An electric field is not applied from one surface to the other surface of the oxide semiconductor layer and current does not flow in the thickness direction (from one surface to the other surface; specifically, in the vertical direction in FIG. 16C) of the stack of the oxide semiconductor layers. The transistor has a structure in which current mainly flows along the interface of the stack of the oxide semiconductor layers; therefore, even when the transistor is irradiated with light or even when a BT stress is applied to the transistor, deterioration of characteristics of the transistor is suppressed or reduced.

By forming a transistor with the use of a stack of a first crystalline oxide semiconductor layer and a second crystalline oxide semiconductor layer, like the oxide semiconductor layer 453, the transistor can have stable electrical characteristics and high reliability.

This embodiment can be implemented in an appropriate combination with any of the structures described in the other embodiments.

Embodiment 6

In this embodiment, the cases where the semiconductor device described in any of the above embodiments is applied to electronic devices will be described with reference to FIGS. 17A to 17F. The cases where the above-described semiconductor device is applied to electronic devices such as a computer, a mobile phone set (also referred to as a mobile phone or a mobile phone device), a portable information terminal (including a portable game machine, an audio reproducing device, and the like), a digital camera, a digital video camera, electronic paper, a television set (also referred to as a television or a television receiver), and the like are described in this embodiment.

Figure 17A:
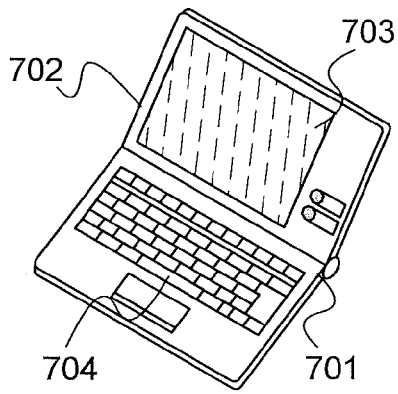
FIGS. 17A to 17F are diagrams each illustrating an electronic device including a semiconductor device.

FIG. 17A illustrates a notebook personal computer, which includes a housing 701, a housing 702, a display portion 703, a keyboard 704, and the like. At least one of the housing 701 and the housing 702 includes the semiconductor device described in any of the above embodiments. Thus, a notebook personal computer that can hold data for a long time, performs writing and reading of data at high speed, and has high reliability of writing and reading of data can be realized.

Figure 17D:
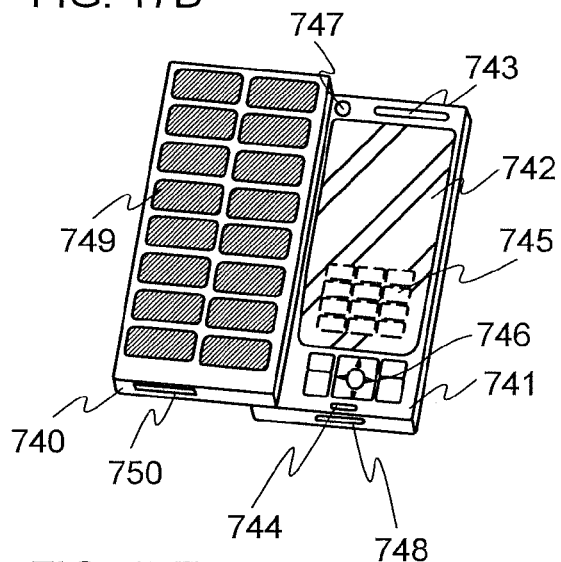
Figure 17B:
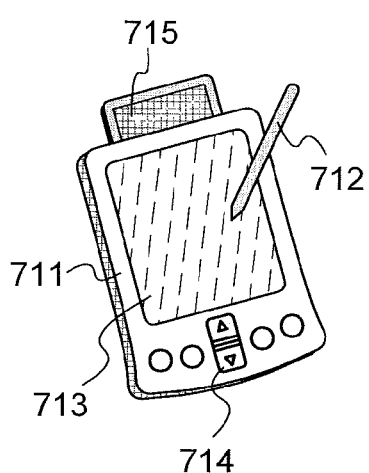

FIG. 17B illustrates a portable information terminal (PDA). A main body 711 is provided with a display portion 713, an external interface 715, operation buttons 714, and the like. Further, a stylus 712 for operation of the portable information terminal, and the like are provided. The main body 711 includes the semiconductor device described in any of the above embodiments. Thus, a portable information terminal that can hold data for a long time, performs writing and reading of data at high speed, and has high reliability of writing and reading of data can be realized.

Figure 17E:
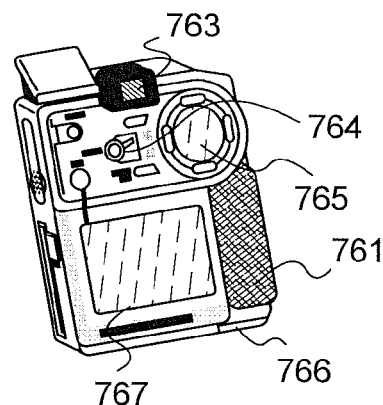
Figure 17C:
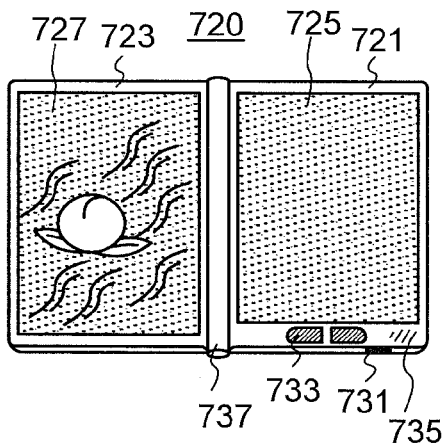

FIG. 17C illustrates an electronic book 720 incorporating electronic paper, which includes two housings, a housing 721 and a housing 723. The housing 721 and the housing 723 include a display portion 725 and a display portion 727, respectively. The housing 721 is connected to the housing 723 by a hinge 737, so that the electronic book can be opened and closed using the hinge 737 as an axis. In addition, the housing 721 is provided with a power switch 731, operation keys 733, a speaker 735, and the like. The semiconductor device described in any of the above embodiments is provided inside at least one of the housings 721 and 723. Thus, an electronic book that can hold data for a long time, performs writing and reading of data at high speed, and has high reliability of writing and reading of data can be realized.

FIG. 17D illustrates a mobile phone set, which includes two housings, a housing 740 and a housing 741. Moreover, the housings 740 and 741 in a state where they are developed as illustrated in FIG. 17D can be slid so that one is lapped over the other. Therefore, the size of the mobile phone set can be reduced, which makes the mobile phone set suitable for being carried around. The housing 741 includes a display panel 742, a speaker 743, a microphone 744, operation keys 745, a pointing device 746, a camera lens 747, an external connection terminal 748, and the like. The housing 740 includes a solar cell 749 for charging the mobile phone set, an external memory slot 750, and the like. An antenna is incorporated in the housing 741. At least one of the housings 740 and 741 includes the semiconductor device described in any of the above embodiments. Thus, a mobile phone set that can hold data for a long time, performs writing and reading of data at high speed, and has high reliability of writing and reading of data can be realized.

FIG. 17E illustrates a digital video camera, which includes a main body 761, a display portion 767, an eyepiece 763, an operation switch 764, a display portion 765, a battery 766, and the like. The main body 761 includes the semiconductor device described in any of the above embodiments. Thus, a digital video camera that can hold data for a long time, performs writing and reading of data at high speed, and has high reliability of writing and reading of data can be realized.

Figure 17F:
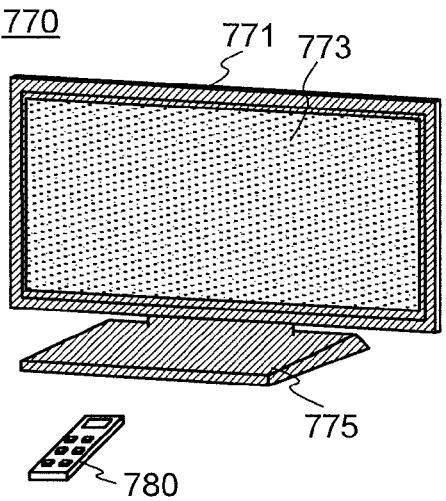

FIG. 17F is a television set 770, which includes a housing 771, a display portion 773, a stand 775, and the like. The television set 770 can be operated with a switch included in the housing 771 or with a remote controller 780. The housing 771 and the remote controller 780 include the semiconductor device described in any of the above embodiments. Thus, a television set that can hold data for a long time, performs writing and reading of data at high speed, and has high reliability of writing and reading of data can be realized.

As described above, the electronic devices described in this embodiment each include the semiconductor device according to any of the above embodiments. Therefore, electronic devices that can hold data for a long time, performs writing and reading of data at high speed, and has high reliability of writing and reading of data can be realized.

This application is based on Japanese Patent Application serial No. 2010-202553 filed with Japan Patent Office on Sep. 10, 2010, the entire contents of which are hereby incorporated by reference.

What is claimed is:

1. A semiconductor device comprising:
a memory cell including a first transistor, a second transistor, and a capacitor, wherein a first gate terminal of the first transistor is electrically connected to the capacitor, a first source terminal of the first transistor is electrically connected to a bit line, and the first transistor includes a semiconductor substrate, wherein a second gate terminal of the second transistor is electrically connected to a word line for an oxide semiconductor, a second source terminal of the second transistor is electrically connected to a bit line for an oxide semiconductor, a second drain terminal of the second transistor is electrically connected to the first gate terminal of the first transistor, and the second transistor includes an oxide semiconductor layer;
a resistor comprising a dual-gate transistor including a third source terminal, a third drain terminal, a third gate terminal, and a fourth gate terminal, wherein the third source terminal and the third gate terminal are electrically connected to a terminal to which power supply voltage is input, and the third drain terminal is electrically connected to the bit line;
a reference potential circuit configured to output a reference potential;
a potential comparison circuit electrically connected to the reference potential circuit and the bit line, the potential comparison circuit configured to compare the reference potential output by the reference potential circuit with a potential of the bit line; and
a control circuit electrically connected to the potential comparison circuit, wherein an output potential of the potential comparison circuit is supplied to a power supply control circuit portion and a state change circuit portion, wherein the state change circuit portion is electrically connected to an input portion of the power supply control circuit portion and the fourth gate terminal of the resistor, and is configured to supply a potential to the fourth gate terminal, and wherein the power supply control circuit portion is electrically connected to the bit line for the oxide semiconductor, and is configured to supply a potential to the bit line for the oxide semiconductor.

2. The semiconductor device according to claim 1, wherein the reference potential circuit is a plurality of reference potential circuits configured to output respective potentials.

3. The semiconductor device according to claim 1, wherein the semiconductor substrate is a single crystal semiconductor substrate.

4. The semiconductor device according to claim 1, wherein the semiconductor substrate includes silicon.

5. The semiconductor device according to claim 1, wherein the oxide semiconductor layer is an oxide semiconductor material including In, Ga, and Zn.

* * * * *